United States Patent
Yagi et al.

(10) Patent No.: US 11,650,262 B2
(45) Date of Patent: May 16, 2023

(54) AGING DETERMINATION METHOD OF BATTERY, AGING DETERMINATION APPARATUS OF BATTERY, MANAGEMENT SYSTEM OF BATTERY, BATTERY-MOUNTED DEVICE, AND NON-TRANSITORY STORAGE MEDIUM

(71) Applicant: KABUSHIKI KAISHA TOSHIBA, Tokyo (JP)

(72) Inventors: Ryosuke Yagi, Yokohama Kanagawa (JP); Yuta Kanai, Tokyo (JP); Norihiro Yoshinaga, Yokohama Kanagawa (JP); Shuichi Uchikoga, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/665,141

(22) Filed: Feb. 4, 2022

(65) Prior Publication Data
US 2022/0381845 A1    Dec. 1, 2022

(30) Foreign Application Priority Data
Jun. 1, 2021    (JP) .............................. JP2021-092258

(51) Int. Cl.
    *G01R 31/392*    (2019.01)
    *G01R 31/389*    (2019.01)
    (Continued)

(52) U.S. Cl.
    CPC ....... *G01R 31/392* (2019.01); *G01R 31/3648* (2013.01); *G01R 31/389* (2019.01); *H01M 10/0525* (2013.01)

(58) Field of Classification Search
    None
    See application file for complete search history.

(56) References Cited

U.S. PATENT DOCUMENTS

| 10,718,817 B2 | 7/2020 | Oguma et al. |
| 10,862,174 B2 | 12/2020 | Tashiro |

(Continued)

FOREIGN PATENT DOCUMENTS

| EP | 2 530 482 A2 | 12/2012 |
| JP | 2012-251806 A | 12/2012 |

(Continued)

OTHER PUBLICATIONS

S. Santhanagopalan, et al., "Parameter Estimation and Life Modeling of Lithium-Ion Cells," J. Electrochemical Society, vol. 155, No. 4, pp. A345-A353 (2008).

*Primary Examiner* — Jas A Sanghera
(74) *Attorney, Agent, or Firm* — Finnegan, Henderson, Farabow, Garrett & Dunner, LLP

(57) ABSTRACT

In an embodiment, an aging determination method of a battery as a target of determination is provided. With regard to a target electrode which is at least one of a positive electrode and a negative electrode of the battery, the method estimates a correction coefficient to correct a difference between lithium concentration distributions in the target electrode at a time of charging with a first electric current and at a time of charging with a second electric current greater than the first electric current based on a difference between electric potentials of a target electrode at the time of charging with the first electric current and at the time of charging with the second electric current, and an impedance of the target electrode at the time of charging with the second electric current.

11 Claims, 6 Drawing Sheets

(51) Int. Cl.
*G01R 31/36* (2020.01)
*H01M 10/0525* (2010.01)

(56) References Cited

U.S. PATENT DOCUMENTS

| | | |
|---|---|---|
| 11,187,754 B2 | 11/2021 | Sugiyama et al. |
| 2015/0276889 A1 | 10/2015 | Osaka et al. |
| 2017/0168119 A1* | 6/2017 | Tagade ................. H01M 10/48 |

FOREIGN PATENT DOCUMENTS

| | | |
|---|---|---|
| JP | 2015-184146 A | 10/2015 |
| JP | 2015-190918 A | 11/2015 |
| JP | 2018-91716 A | 6/2018 |
| JP | 2019-132655 A | 8/2019 |
| JP | 2020-109367 A | 7/2020 |
| JP | 2022-85385 A | 6/2022 |
| WO | WO 2017/047192 A1 | 3/2017 |

* cited by examiner

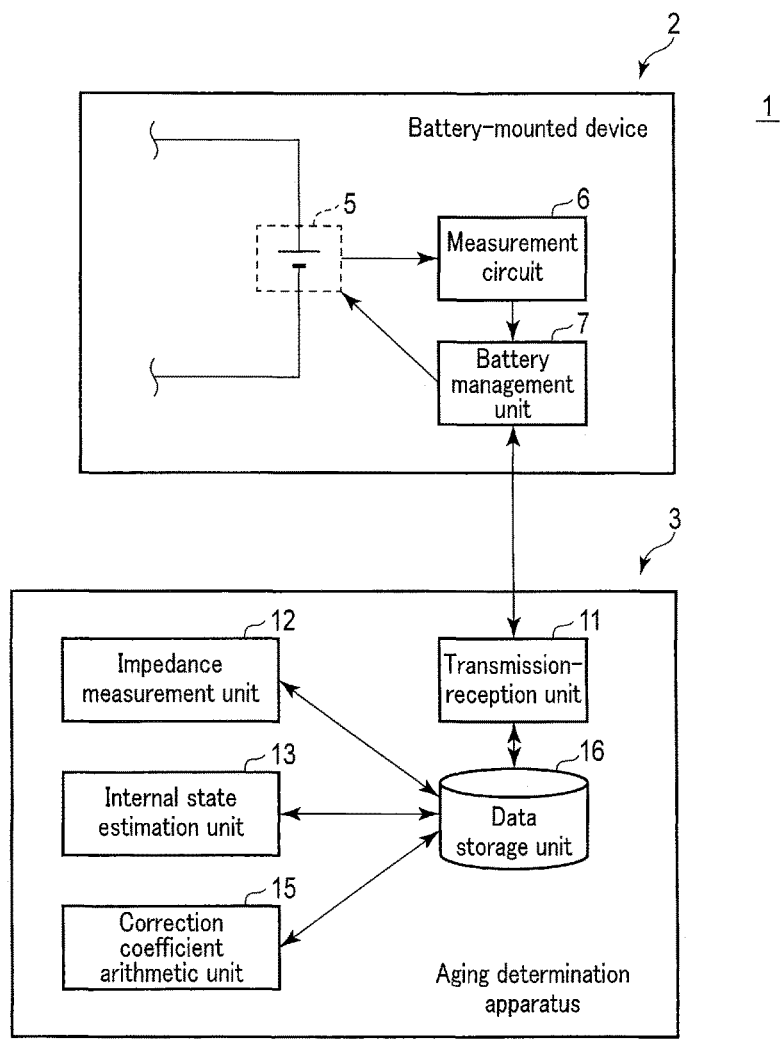
F I G. 1

AGING DETERMINATION METHOD OF BATTERY, AGING DETERMINATION APPARATUS OF BATTERY, MANAGEMENT SYSTEM OF BATTERY, BATTERY-MOUNTED DEVICE, AND NON-TRANSITORY STORAGE MEDIUM

CROSS-REFERENCE TO RELATED APPLICATIONS

This application is based upon and claims the benefit of priority from Japanese Patent Application No. 2021-092258, filed Jun. 1, 2021, the entire contents of which are incorporated herein by reference.

FIELD

Embodiments described herein relate generally to an aging determination method of a battery, an aging determination apparatus of the battery, a management system of the battery, a battery-mounted device, and a non-transitory storage medium.

BACKGROUND

In recent years, regarding batteries such as secondary batteries, an internal state of a battery is estimated on the basis of measurement data including measurement values such as an electric current and a voltage of the battery, and aging of the battery is determined on the basis of an estimation result of the internal states or the like. In such a determination, when estimating the internal state of the battery as a target of determination, a capacity of a positive electrode which is a capacity of a positive electrode active material of the battery, a capacity of a negative electrode which is a capacity of a negative electrode active material of the battery, an impedance (internal resistance) of the battery, and the like are estimated as internal state parameters indicative of the internal states of the battery. Based on the estimated internal state parameters of the battery, a degree of aging, an aging rate, etc. of the battery are determined.

In the case of a battery, such as a secondary battery, it is desired that internal states of the battery be estimated in a state where the battery is rapidly charged at a comparatively high charging rate to reduce charging time. For example, an impedance of the battery at each of a plurality of frequencies can be measured by supplying an electric current to the battery in a current waveform in which an alternate current is superposed on a charge current at a high charging rate. However, if a lithium ion secondary battery or the like is rapidly charged at a high charging rate, diffusion of lithium ions will be a rate-limiting factor in at least one of the positive electrode and the negative electrode. Therefore, if a secondary battery or the like is rapidly charged at a high rate, the lithium concentration will be non-uniform in at least one of the positive electrode and the negative electrode, and the lithium concentration distribution in at least one of the positive electrode and the negative electrode will be unsteady. When determining aging of the battery, it is required that an influence of non-uniformity of the lithium concentration be appropriately corrected, so that the internal states of the battery can be estimated, even if the lithium concentration is non-uniform in at least one of the positive electrode and the negative electrode due to a rapid charging of the battery.

BRIEF DESCRIPTION OF THE DRAWINGS

FIG. 1 is a schematic view illustrating a management system of a battery according to a first embodiment.

DETAILED DESCRIPTION

Figure 2:
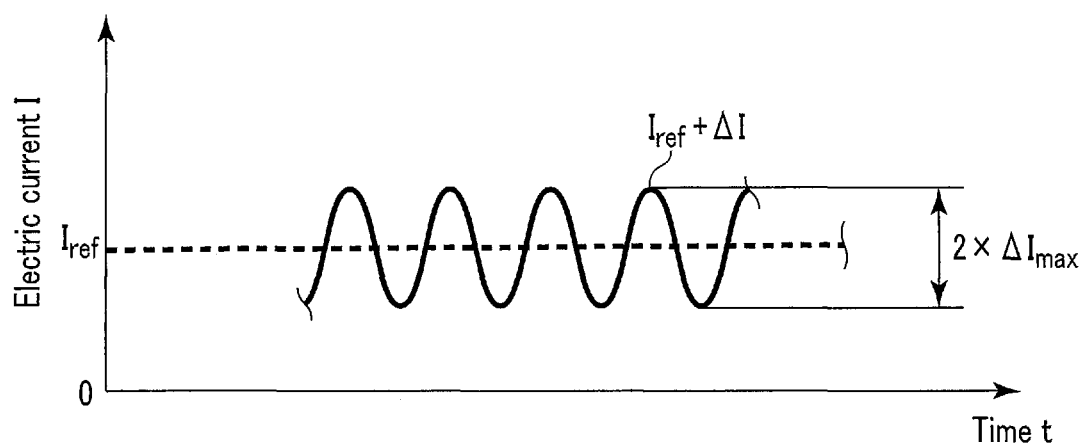
FIG. 2 is a schematic view illustrating an example of an electric current flowing through a battery when measuring an impedance of the battery according to the first embodiment.

According to an embodiment, an aging determination method for determining aging of a battery as a target of determination is provided. With regard to a target electrode which is at least one of a positive electrode and a negative electrode of the battery, the aging determination method estimates a correction coefficient to correct a difference between a lithium concentration distribution in the target electrode at a time of charging with a first electric current and a lithium concentration distribution in the target electrode at a time of charging with a second electric current greater than the first electric current based on a difference between an electric potential of a target electrode at the time of charging of the battery with the first electric current and an electric potential of the target electrode at the time of charging of the battery with the second electric current, and an impedance of the target electrode at the time of charging with the second electric current.

Hereinafter, the embodiments will be described with reference to the accompanying drawings.

First Embodiment

A first embodiment will be described first as an example of embodiments. FIG. 1 is a schematic view showing a management system of a battery according to the first embodiment. As shown in FIG. 1, a management system 1 includes a battery-mounted device 2 and an aging determination apparatus 3. A battery 5, a measurement circuit 6, and a battery management unit (BMU) 7 are mounted in the battery-mounted device 2. Examples of the battery-mounted device 2 include a large-sized electricity storage device for an electric power system, a smartphone, a vehicle, a stationary power source device, a robot, and a drone. Examples of the vehicle serving as the battery-mounted device 2 include a railway vehicle, an electric bus, an electric automobile, a plug-in hybrid automobile, and an electric bicycle.

The battery 5 is, for example, a secondary battery such as a lithium ion secondary battery. The battery 5 may be formed of a unit cell (unit battery), or may be a battery module or a cell block formed by electrically connecting a plurality of unit cells. When the battery 5 is formed of a plurality of unit cells, the unit cells may be electrically connected in series, or may be electrically connected in parallel, in the battery 5. In addition, in the battery 5, both of a series-connection structure in which unit cells are connected in series, and a parallel-connection structure in which unit cells are connected in parallel, may be formed. Furthermore, the battery 5 may be any one of a battery string, a battery array, and a storage battery, in each of which a plurality of battery modules are electrically connected.

The measurement circuit 6 detects and measures parameters relating to the battery 5 in a state of charging or discharging the battery 5. The measurement circuit 6 detects and measures the parameters periodically at a predetermined timing in one charge or discharge of the battery 5. In other words, in one charge, discharge, or the like of the battery 5, the measurement circuit measures parameters relating to the battery 5 at each of a plurality of measurement time points. Thus, the parameters relating to the battery 5 are measured a plurality of times. The parameters relating to the battery 5 include an electric current flowing through the battery 5, a voltage of the battery 5, a temperature of the battery 5, etc. Therefore, the measurement circuit 6 includes an ammeter for measuring an electric current, a voltmeter for measuring a voltage, a temperature sensor for measuring a temperature, etc.

The battery management unit 7 constitutes a processing device (computer) for managing the battery 5 by controlling charge and discharge of the battery 5, etc., and includes a processor and a storage medium (non-transitory storage medium). The processor includes any of a central processing unit (CPU), an application specific integrated circuit (ASIC), a microcomputer, a field programmable gate array (FPGA), digital signal processor (DSP), etc. The storage medium may include a main storage device, such as a memory, and an auxiliary storage device. Examples of the storage medium include a magnetic disk, an optical disk (CD-ROM, CD-R, DVD, etc.), a magnetic optical disk (MO etc.), a semiconductor memory, etc. The battery management unit 7 may include one or more processors, and one or more storage media. In the battery management unit 7, the processor performs processing by executing a program or the like stored in the storage medium or the like. The program executed by the battery management unit 7 may be stored in a computer (server) connected thereto via a network, such as the Internet, or in a server or the like in a cloud environment. In this case, the processor downloads the program via the network.

The aging determination apparatus 3 determines whether aging of the battery 5 has occurred based on information relating to the battery 5. Thus, the battery 5 is a target of determination in the aging determination performed by the aging determination apparatus 3. In the present embodiment, the aging determination apparatus 3 is provided outside the battery-mounted device 2. The aging determination apparatus 3 includes a transmission-reception unit 11, an impedance measurement unit 12, an internal state estimation unit 13, a correction coefficient arithmetic unit 15, and a data storage unit 16. The aging determination apparatus 3 is, for example, a server which can communicate with the battery management unit 7. In this case, similarly to the battery management unit 7, the aging determination apparatus 3 also includes a processor and a storage medium. The transmission-reception unit 11, the impedance measurement unit 12, the internal state estimation unit 13, and the correction coefficient arithmetic unit 15 execute parts of the processes which are executed by the processor or the like of the aging determination apparatus 3, and the storage medium of the aging determination apparatus 3 functions as the data storage unit 16.

In one example, the aging determination apparatus 3 may be a cloud server which is constructed in a cloud environment. The infrastructure of the cloud environment is constituted by a virtual processor, such as a virtual CPU, and a cloud memory. Thus, when the aging determination apparatus 3 is the cloud server, the transmission-reception unit 11, the impedance measurement unit 12, the internal state estimation unit 13, and the correction coefficient arithmetic unit 15 execute parts of processes which are executed by the virtual processor. In addition, the cloud memory functions as the data storage unit 16.

The data storage unit 16 may be provided in a computer which is separated from the battery management unit 7 and the aging determination apparatus 3. In this case, the aging determination apparatus 3 is connected via a network to the computer in which the data storage unit 16 or the like is provided. The aging determination apparatus 3 may be mounted in the battery-mounted device 2. In this case, the aging determination apparatus 3 is constituted by a processing device or the like, which is mounted in the battery-mounted device 2. Further, when the aging determination apparatus 3 is mounted in the battery-mounted device 2, one processing device or the like, which is mounted in the battery-mounted device 2, may execute a process (to be described later) of the aging determination apparatus 3, and may also execute a process of the battery management unit 7, such as control or the like of the charge and discharge of the battery 5. Hereinafter, the process of the aging determination apparatus 3 will be described.

The transmission-reception unit 11 communicates with a processing device other than the aging determination apparatus 3 via the network. The transmission-reception unit 11 receives, for example, the measurement data including the measurement result in the measurement circuit 6 of the parameters relating to the battery 5, from the battery management unit 7. The measurement data is generated by the battery management unit 7 or the like based on the measurement result etc. in the measurement circuit 6. The measurement data includes measurement values of parameters relating to the battery 5 at each of a plurality of measurement time points (a plurality of times of measurement). The measurement data includes a time variation (time history) of the parameters relating to the battery 5. Thus, the measurement data includes a time variation (time history) of the electric current of the battery 5, and a time variation (time history) of the voltage of the battery 5, a time variation (time history) of the temperature of the battery 5, etc. The transmission-reception unit 11 writes the received measurement data into the data storage unit 16.

At least one of the battery management unit 7 and the aging determination apparatus 3 may estimate at least one of a charge amount and a state of charge (SOC) of the battery 5 based on the measurement result etc. of the parameters relating to the battery 5 in the measurement circuit 6. The aging determination apparatus 3 may acquire, as data included in the measurement data, an estimation value of either the charge amount or the SOC of the battery 5, and a time variation (time history) of either the charge amount or the SOC of the battery 5. The measurement data may include data indicative of a relation of the above-described measured parameters relating to the battery 5 to the estimated charge amount or SOC of the battery 5. In this case, for example, the measurement data may include data indicative of a relation of the measured voltage of the battery 5 to the estimated charge amount or SOC of the battery 5.

A real-time charge amount of the battery 5 can be calculated based on the charge amount of the battery 5 at a time of, for example, the start of charge or discharge, and the time variation of the electric current of the battery 5. In this case, based on the time variation of the electric current, a current integration value of the electric current of the battery 5 from the start time of charge or discharge is calculated. Further, the charge amount of the battery 5 is calculated based on the charge amount of the battery 5 at the time of, for example, the start of charge or discharge, and the calculated current integration value.

The SOC of the battery 5 is defined by, for example, the voltage of the battery 5. In the battery 5, a lower-limit voltage $V_{min}$ and an upper-limit voltage $V_{max}$ are defined. When the SOC of the battery 5 is defined based on the voltage of the battery 5, the SOC of the battery 5 is defined based on a change in voltage in a state where the lithium concentration in each of the positive electrode and the negative electrode is steady or quasi-steady. In one example, the SOC of the battery 5 is defined based on a change in voltage under a predetermined condition of charge in which the lithium concentration in each of the positive electrode and the negative electrode is steady or quasi-steady. In this case, a state where the voltage of the battery 5 under the predetermined condition of charge is the lower limit voltage $V_{min}$ is defined as an SOC of 0%, and a state where the voltage of the battery 5 under the predetermined condition of charge is the upper-limit voltage $V_{max}$ is defined as an SOC of 100%.

A charging capacity of the battery 5 ranging from the state of the SOC of 0% to the state of the SOC of 100% is a battery capacity of the battery 5. A real-time SOC of the battery 5 is a ratio of the real-time charge amount of the battery 5 to the battery capacity of the battery 5 when the charge amount of the SOC of 0% is defined as a reference (0). Therefore, the SOC of the battery 5 can be calculated from the battery capacity and the charge amount of the battery 5. In another example, the SOC of the battery 5 may be defined based on a change in open circuit voltage (OCV), which is a change in voltage in a state where the lithium concentration in each of the positive electrode and the negative electrode is steady, instead of a change in voltage under the predetermined condition of charge. After a predetermined time period has passed since the charge or discharge was stopped, the lithium concentration becomes steady. Therefore, the SOC is defined based on the open circuit voltage by associating the open circuit voltage at that time with the SOC.

The impedance measurement unit 12 measures an impedance of the battery 5 as a target of determination based on the measurement data received by the transmission-reception unit 11. In the measurement of an impedance of the battery 5 by the impedance measurement unit 12, the battery management unit 7 or the like supplies, to the battery 5, an electric current $(I_{ref}+\Delta I)$ having a current waveform in which a current fluctuation component $\Delta I$ that periodically fluctuates with a predetermined current fluctuation width $(2 \times \Delta I_{max})$ is superposed on an electric current of a reference current value $I_{ref}$. Therefore, when measuring an impedance of the battery 5, the electric current having a current waveform in which a current value periodically fluctuates with a predetermined current fluctuation width $(2 \times \Delta I_{max})$ around the reference current value $I_{ref}$ is supplied to the battery 5 as a charge current. Here, the reference current value $I_{ref}$ corresponds to a time average value of the electric current supplied to the battery 5, and the current fluctuation width $(2 \times \Delta I_{max})$ corresponds to a peak-to-peak value of the current fluctuation component $\Delta I$ in which the current value periodically fluctuates.

FIG. 2 is a schematic diagram showing an example of an electric current flowing through the battery when measuring an impedance of the battery according to the first embodiment. In FIG. 2, the abscissa axis represents a time t, and the ordinate axis represents an electric current I. In the example of FIG. 2, the current fluctuation component $\Delta I(t)$ that periodically fluctuates with the current fluctuation width $(2 \times \Delta I_{max})$ is superposed on the electric current of the reference current value $I_{ref}$, and an electric current $(I_{ref}+\Delta I(t))$ having a current waveform in which a current value periodically fluctuates around the reference current value $I_{ref}$ is supplied to the battery 5 as a charge current. The electric current $(I_{ref}+\Delta I(t))$ is a trace of the time variation of charge current. The ratio of the reference current value $I_{ref}$ to the battery capacity of the battery 5 is defined as a charging rate of the battery 5. Furthermore, it is preferable that the electric current $(I_{ref}+\Delta I(t))$ be continuously supplied to the battery 5 from the start of charge to the end of charge of the battery 5. However, during the period from the start of charge to the end of charge of the battery 5, the current supply to the battery 5 may be stopped for an instant, or the electric current supplied to the battery 5 may be reduced to a value smaller than the reference current value $I_{ref}$. In this case, while the electric current supplied to the battery is being stopped or reduced, an impedance of the battery 5 is not measured. In an example of FIG. 2, the current waveform is a sinusoidal wave (sine wave); however, the current waveform may be any waveform other than a sinusoidal wave, such as a triangular wave or a saw-tooth wave.

The measurement circuit 6 measures each of an electric current and a voltage of the battery 5 at a plurality of measurement time points in a state where an electric current having a current waveform in which a current value periodically fluctuates is supplied to the battery 5, such as a state where the aforementioned electric current $(I_{ref}+\Delta I(t))$ is supplied to the battery 5. Then, the transmission-reception unit 11 of the aging determination apparatus 3 receives, as the aforementioned measurement data, a measurement result of each of the electric current and the voltage of the battery 5 which is being charged with a charge current having a current waveform in which the current value periodically fluctuates. The measurement result of each of the electric current and the voltage of the battery 5 supplied with an electric current having a current waveform in which the current value periodically fluctuates includes a measurement value of each of the electric current and the voltage of the battery 5 at each of the measurement time points, a time variation (time history) of each of the electric current and the voltage of the battery 5, etc.

The impedance measurement unit 12 calculates a frequency characteristic of the impedance of the battery 5 based on the measurement result received by the transmission-reception unit 11. Thus, the frequency characteristic of the impedance of the battery 5 is calculated by causing an electric current to flow through the battery 5 in a current waveform in which the current value periodically fluctuates. In one example, the impedance measurement unit 12 calculates a peak-to-peak value (fluctuation width) in a periodic change of the electric current of the battery 5 based on a time variation of the electric current of the battery 5, and calculates a peak-to-peak value (fluctuation width) in a periodic change of the voltage of the battery 5 based on a time variation of the voltage of the battery 5. Furthermore, the impedance measurement unit 12 calculates an impedance of the battery 5 from the ratio of the peak-to-peak value of the voltage to the peak-to-peak value of the electric current. Then, the impedance of the battery 5 is calculated as described above from a plurality of current waveforms at mutually different frequencies, thereby measuring the frequency characteristic of the impedance of the battery 5.

In another example, an electric current having a current waveform of a reference frequency is caused to flow through the battery, and a time variation of each of the electric current and the voltage of the battery 5 is acquired as measurement data. The impedance measurement unit 12 Fourier-transforms a time variation of each of the electric current and the voltage of the battery 5, thereby calculating a frequency spectrum or the like of each of the electric current and the voltage of the battery 5 as a frequency characteristic of each of the electric current and the voltage of the battery 5. The calculated frequency characteristic of each of the electric current and the voltage of the battery 5 indicates a component of an integral multiple of the reference frequency in addition to a component of the reference frequency described above. Furthermore, the impedance measurement unit 12 calculates an auto-correlation function of a time variation of the electric current of the battery 5 and a mutual correlation function between the time variation of the electric current of the battery 5 and the time variation of the voltage of the battery 5 based on the frequency characteristic of each of the electric current and the voltage of the battery 5. Using the auto-correlation function and the mutual correlation function, the impedance measurement unit 12 calculates a frequency characteristic of the impedance of the battery 5. A frequency characteristic of the impedance of the battery is calculated by, for example, dividing the mutual correlation function by the auto-correlation function.

The impedance measurement unit 12 acquires, for example, a complex impedance plot (Cole-Cole plot) of the impedance as a measurement result of the frequency characteristic of the impedance of the battery 5. The complex impedance plot indicates an impedance of the battery 5 for each of the plurality of frequencies. Furthermore, the complex impedance plot indicates a real component and an imaginary component of the impedance of the battery 5 for each of the plurality of frequencies. The method for measuring a frequency characteristic of the impedance of the battery by causing an electric current to flow in a current waveform in which the current value periodically fluctuates, and the complex impedance plot as a measurement result of the frequency characteristic of the impedance of the battery, are disclosed in Reference Document 1 (Jpn. PAT. Appln. KOKAI Publication No. 2019-132655) and Reference Document 2 (International Publication No. 2017/047192). In this embodiment, the frequency characteristic of the impedance of the battery 5 may be measured in the same manner as in either Reference Document 1 or Reference Document 2.

The impedance measurement unit 12 calculates an impedance of each of the positive electrode and the negative electrode of the battery 5 based on the measurement results of the impedances of the battery 5 including the frequency characteristic of the impedance of the battery 5. The impedances of the battery 5 include an impedance of each of the positive electrode and the negative electrode, a resistor of a separator, etc. The impedance of each of the positive electrode and the negative electrode includes an ohmic resistance, a reaction resistance, a diffusion resistance, etc. In each of the positive electrode and the negative electrode, the ohmic resistance includes an electric resistance of the electrode (a current collector and an active material containing layer), the reaction resistance includes a resistance to a charge transfer on an interface of the electrode, and a resistance due to coating formed on the surface of the electrode, and the diffusion resistance includes a resistance to diffusion of ions in the active material, such as lithium ions.

The data storage unit 16 stores an equivalent circuit model for the positive electrode, the negative electrode, and the separator of the battery 5. The equivalent circuit model indicates the relationship between a frequency and each of the ohmic resistance of the positive electrode, the reaction resistance of the positive electrode, the diffusion resistance of the positive electrode, the ohmic resistance of the negative electrode, the reaction resistance of the negative electrode, the diffusion resistance of the negative electrode, the resistance of the separator, etc. In other words, the equivalent circuit model indicates a frequency characteristic of each of the aforementioned resistances. The frequency characteristic of each of the aforementioned resistances varies in accordance with each of the temperature and the charge amount (SOC) of the battery 5. Therefore, in the equivalent circuit model, the frequency characteristics of the respective resistances are set for each of the mutually different temperatures and set for each of the mutually different charge amounts (SOC).

The impedance measurement unit 12 performs a fitting calculation using the measurement result of the frequency characteristic of the impedance of the battery 5, and using the frequency characteristics of the respective resistances in the equivalent circuit model. At this time, the fitting calculation is performed to obtain a variable using the ohmic resistance of the positive electrode, the reaction resistance of the positive electrode, the diffusion resistance of the positive electrode, the ohmic resistance of the negative electrode, the reaction resistance of the negative electrode, the diffusion resistance of the negative electrode, the resistance of the separator, etc. as variables. The impedance measurement unit 12 calculates an impedance of the positive electrode from the ohmic resistance of the positive electrode, the reaction resistance of the positive electrode, and the diffusion resistance of the positive electrode obtained by the fitting calculation. The impedance measurement unit 12 also calculates an impedance of the negative electrode from the ohmic resistance of the negative electrode, the reaction resistance of the negative electrode, and the diffusion resistance of the negative electrode obtained by the fitting calculation. Thus, the impedance of each of the positive electrode and the negative electrode is measured.

According to this embodiment, as described above, the impedance measurement unit 12 calculates an impedance of each of the positive electrode and the negative electrode, using the measurement result of the frequency characteristic of the impedance of the battery 5 and using the equivalent circuit model. Therefore, in this embodiment, the frequency characteristic is calculated and measured for the impedance of each of the positive electrode and the negative electrode of the battery 5. In other words, the frequency characteristic of the impedance of the positive electrode and the frequency characteristic of the impedance of the negative electrode are separate from the frequency characteristics of the impedance of the battery 5. The impedance measurement unit 12 acquires, for example, the aforementioned complex impedance plot (Cole-Cole plot) of the impedance as a measurement result of the frequency characteristic of the impedance of each of the positive electrode and the negative electrode. The impedance measurement unit 12 writes the measurement result of the impedance of the battery 5 and the measurement result of each of the positive electrode and the negative electrode of the battery 5 in the data storage unit 16.

Figure 3:
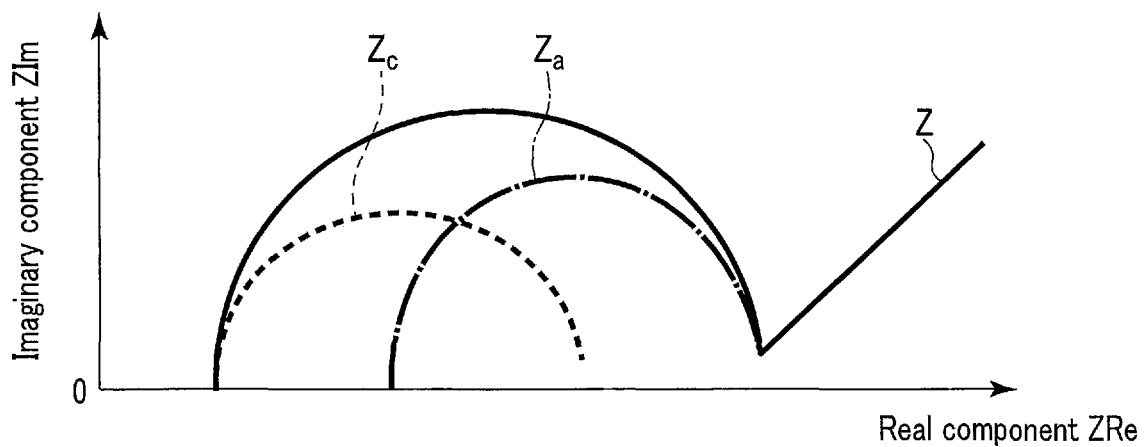
FIG. 3 is a schematic view illustrating an example of a frequency characteristic of an impedance of a battery and a frequency characteristic of an impedance of each of a positive electrode and a negative electrode of the battery according to the first embodiment.

FIG. 3 is a schematic view illustrating an example of a frequency characteristic of an impedance of a battery and a frequency characteristic of an impedance of each of a positive electrode and a negative electrode of the battery according to the first embodiment. FIG. 3 shows frequency characteristics of the impedances as a complex impedance plot. In FIG. 3, the abscissa axis indicates a real component ZRe of an impedance, and the ordinate axis indicates an imaginary component ZIm of the impedance. Furthermore, FIG. 3 shows a frequency characteristic Z of the impedance of the battery 5, a frequency characteristic $Z_c$ of the impedance of the positive electrode of the battery 5, and a frequency characteristic $Z_a$ of the impedance of the negative electrode of the battery 5. In the example of FIG. 3, the frequency characteristic $Z_c$ of the impedance of the positive electrode and the frequency characteristic $Z_a$ of the impedance of the negative electrode are separated from the frequency characteristic Z of the impedance of the battery 5.

Equivalent circuit models of the positive electrode, the negative electrode, and the separator of the battery 5 are disclosed in Reference Document 1 and Reference Document 2. The impedance measurement unit 12 may calculate each of the aforementioned resistances by performing the fitting calculation using the measurement result of the frequency characteristic of the impedance of the battery 5, and using the equivalent circuit model disclosed in either Reference Document 1 or Reference Document 2. In this case also, an impedance of the positive electrode is calculated using the ohmic resistance of the positive electrode, the reaction resistance of the positive electrode, and the diffusion resistance of the positive electrode obtained by the fitting calculation, and an impedance of the negative electrode is calculated using the ohmic resistance of the negative electrode, the reaction resistance of the negative electrode, and the diffusion resistance of the negative electrode obtained by the fitting calculation. Furthermore, in Reference Document 1 and Reference Document 2, the complex impedance plot indicates portions respectively corresponding to the ohmic resistance, the reaction resistance, and the diffusion resistance.

In the state where the battery 5 is charged with the aforementioned electric current ($I_{ref}+\Delta I(t)$), the impedance measurement unit 12 generates the complex impedance plot for the frequency characteristic of the impedance of the battery 5 for each of the mutually different charge amounts (SOC), and measures the impedance of the battery 5. The impedance measurement unit 12 also generates the complex impedance plot for the frequency characteristic of the impedance of each of the positive electrode and the negative electrode for each of the mutually different charge amounts (SOC) at which the impedance of the battery 5 is measured, and measures the impedance of each of the positive electrode and the negative electrode.

Furthermore, the impedance measurement unit 12 measures the impedance of the battery 5 and measures the impedance of each of the positive electrode and the negative electrode as described above, in each of the state where the battery 5 is charged by supply of the first electric current and the state where the battery 5 is charged by supply of the second electric current greater than the first electric current. At the time of charging of the battery 5 with the first electric current, the reference current value is set to a first reference current value (first average current value) $I1_{ref}$, and an electric current having a current waveform in which a current value periodically fluctuates around the first reference current value $I1_{ref}$ is supplied to the battery 5. Thus, at the time of charging of the battery 5 with the first electric current, a current having a current waveform ($I1_{ref}+\Delta I$) in which a current fluctuation component $\Delta I$ that periodically fluctuates is superposed on the electric current of the first reference current value $I1_{ref}$ is supplied. On the other hand, at the time of charging of the battery 5 with the second electric current, the reference current value is set to a second reference current value (second average current value) $I2_{ref}$ greater than the first reference current value $I1_{ref}$, and an electric current having a current waveform in which a current value periodically fluctuates around the second reference current value $I2_{ref}$ is supplied to the battery 5. Thus, at the time of charging of the battery 5 with the second electric current, a current having a current waveform ($I2_{ref}+\Delta I$) in which a current fluctuation component $\Delta I$ that periodically fluctuates is superposed on the electric current of the second reference current value $I2_{ref}$ is supplied.

In one example, the current fluctuation width ($2\times\Delta I_{max}$) of the current fluctuation component $\Delta I$ in the current waveform of the first electric current is the same or substantially the same as that in the current waveform of the second electric current. Further, the current fluctuation width ($2\times I_{max}$) in the current waveform of each of the first electric current and the second electric current is smaller than the difference value between the first reference current value $I1_{ref}$ and the second reference current value $I2_{ref}$. The first reference current value $I1_{ref}$ of the first electric current is 0.5 C or smaller in terms of the charging rate, preferably, 0.3 C or smaller. Therefore, when charged with the first electric current, the battery 5 is charged at a low charging rate. On the other hand, the second reference current value $I2_{ref}$ of the second electric current is 1 C or more in terms of the charging rate, preferably, 3 C or more. Therefore, when charged with the second electric current, the battery 5 is rapidly charged at a high charging rate.

At each of the time of charging with the first electric current and the time of charging with the second electric current, the impedance measurement unit 12 measures the impedance of the battery 5 and the impedance of each of the positive electrode and the negative electrode for each of the mutually different charge amounts (SOC). At the time of charging with the first electric current when the battery 5 is charged at a low charging rate, the impedance measurement unit 12 measures the impedance of the battery 5 and the impedance of each of the positive electrode and the negative electrode at an interval of 3% to 5% in terms of SOC. On the other hand, at the time of charging with the second electric current when the battery 5 is charged at a high charging rate, the impedance measurement unit 12 preferably measures the impedance of the battery 5 and the impedance of each of the positive electrode and the negative electrode at an interval of 10% to 20% in terms of SOC. In the measurement of the impedance at the time of charging with the second electric current, an influence of noise on the measurement of the frequency characteristic of the impedance of the battery 5, such as the complex impedance plot, is suppressed by increasing the interval of the charge amounts (SOC) for measuring the impedance.

The internal state estimation unit 13 acquires the impedance of the battery 5 measured at each of the charge amounts at the time of charging with the first electric current, and the impedance of each of the positive electrode and the negative electrode measured at each of the charge amounts at the time of charging with the first electric current. The internal state estimation unit 13 estimates an internal state of the battery 5 based on the measurement result of the impedance of each of the positive electrode and the negative electrode measured at each of the charge amounts at the time of charging with the first electric current. When the battery 5 is charged with the first electric current, since the battery 5 is charged at a low charging rate as described above, lithium ions are appropriately diffused uniformly in each of the positive electrode and the negative electrode. Furthermore, heat generation inside the battery 5 is suppressed, and the temperature distribution is uniform or substantially uniform in the battery 5. Therefore, at the time of charging with the first electric current, in each of the positive electrode and the negative electrode, the lithium concentration in each of the active material particles is uniform or substantially uniform. Accordingly, the lithium concentration in each of the positive electrode and the negative electrode is uniform or substantially uniform. Therefore, at the time of charging with the first electric current, the lithium concentration distribution in each of the positive electrode and the negative electrode is steady or quasi-steady. In this description, the lithium concentration distribution is a parameter indicative of a lithium concentration non-uniformity in the positive electrode or the negative electrode, for example a difference between a lithium concentration at an interface of an electrolyte that is in contact with the active material and a lithium concentration in a central portion of the active material. The unit of the difference between the lithium concentration at an interface of the active material and the lithium concentration in the central portion of the active material is, for example, mol/m³.

The internal state estimation unit 13 estimates an internal state of the battery 5 by estimating internal state parameters of the battery 5. The internal state parameters of the battery 5 include a capacity (reaction area) of the positive electrode corresponding to the capacity of the positive electrode active material, and a capacity (reaction area) of the negative electrode corresponding to the capacity of the negative electrode active material. The internal state parameters also include an initial discharge amount of the positive electrode and an initial charge amount of the negative electrode, and may include the impedance (internal resistance) of the battery 5 described above, and the impedance of each of the positive electrode and the negative electrode. Furthermore, the internal state parameters of the battery 5 include a shift of operation window (SOW), which is a gap between the initial discharge amount of the positive electrode and the initial charge amount of the negative electrode. The internal state parameters also include the lithium concentration in the positive electrode and the lithium concentration in the negative electrode, and include an electric potential range in which the positive electrode is available and an electric potential range in which the negative electrode is available.

Figure 4:
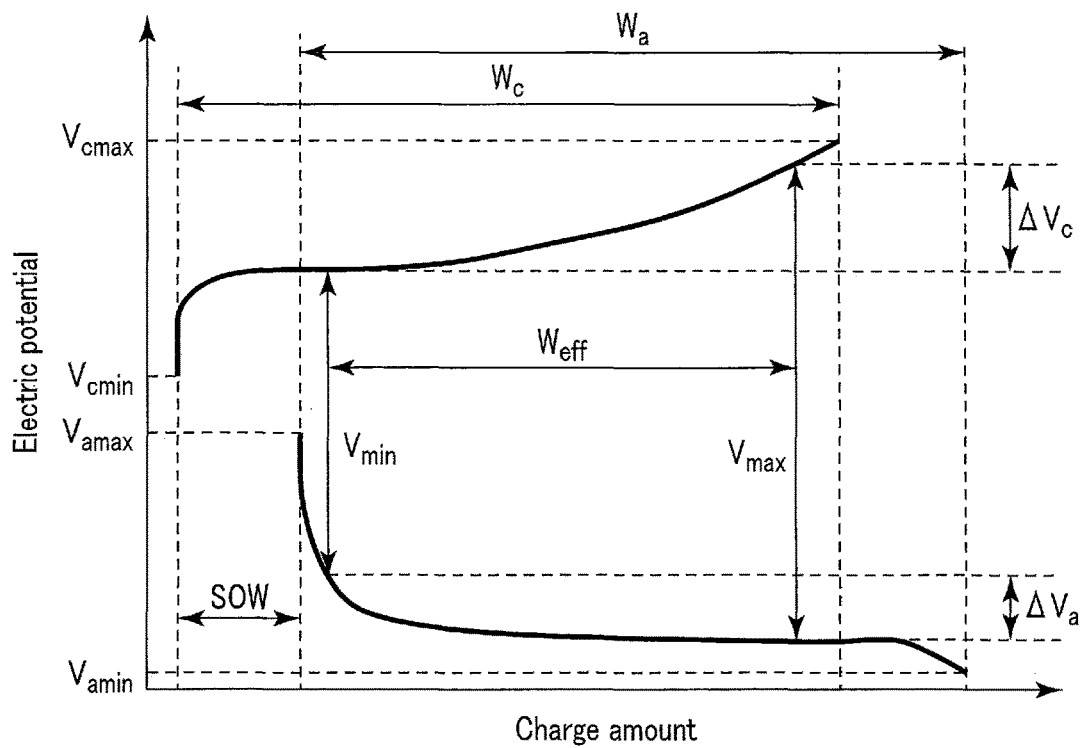
FIG. 4 is a schematic view for explaining internal state parameters indicative of internal states of the battery.

FIG. 4 is a schematic view for explaining the internal state parameters indicative of the internal states of the battery. In FIG. 4, the abscissa axis represents a charge amount, and the ordinate axis represents an electric potential. The internal state parameters, such as the capacity of the positive electrode and the capacity of the negative electrode, are defined based on an electric potential variation of the positive electrode and an electric potential variation of the negative electrode, in a state where the lithium concentration distribution in each of the positive electrode and the negative electrode is steady or quasi-steady. In one example, the internal state parameters are defined based on an electric potential variation of the positive electrode and an electric potential variation of the negative electrode under a predetermined condition of charge in which the lithium concentration distribution in each of the positive electrode and the negative electrode is steady or quasi-steady. For example, the internal state parameters are defined based on the electric potential variation of the positive electrode and the negative electrode when the battery 5 is charged with the first electric current (first reference current value $I1_{ref}$) FIG. 4 shows an electric potential variation of the positive electrode and an electric potential variation of the negative electrode, in a state where the lithium concentration distribution in each of the positive electrode and the negative electrode is steady or quasi-steady.

As shown in FIG. 4, in the battery 5, a lower limit electric potential $V_{cmin}$ and an upper limit electric potential $V_{cmax}$ are defined for the electric potential of the positive electrode under the predetermined condition of charge, and the greater the charge amount of the battery, the higher the electric potential of the positive electrode. In the positive electrode, the discharge amount in a state where the electric potential of the positive electrode is the lower limit electric potential $V_{cmin}$ is defined as the initial discharge amount of the positive electrode, and the discharge amount in a state where the electric potential of the positive electrode is the upper limit electric potential $V_{cmax}$ is defined as an upper limit discharge amount of the positive electrode. Further, a discharge amount in a range from the initial discharge amount to the upper limit discharge amount of the positive electrode is defined as a capacity $w_c$ of the positive electrode of the battery 5. Furthermore, in the battery 5, a lower limit electric potential $V_{amin}$ and an upper limit electric potential $V_{amax}$ are defined for the electric potential of the negative electrode under the predetermined condition of charge, and the greater the charge amount of the battery, the lower the electric potential of the negative electrode. In the negative electrode, the charge amount in a state where the electric potential of the negative electrode is the upper limit electric potential $V_{amax}$ is defined as the initial charge amount of the negative electrode, and the charge amount in a state where the electric potential of the negative electrode is the lower limit electric potential $V_{amax}$ is defined as an upper limit charge amount of the negative electrode. Further, a charge amount in a range from the initial charge amount to the upper limit charge amount of the negative electrode is defined as a capacity $w_a$ of the negative electrode of the battery 5.

Furthermore, FIG. 4 shows the SOW, which is one of the internal state parameters, and the battery capacity $W_{eff}$, which is one of the characteristics of the battery. The battery capacity $W_{eff}$ corresponds to the charge amount that causes the voltage of the battery 5 to increase from the lower limit voltage $V_{min}$ to the upper limit voltage $V_{max}$ under the predetermined condition of charge. In the electric potential of the positive electrode under the predetermined condition of charge, a range between an electric potential corresponding to the lower limit voltage $V_{min}$ and an electric potential corresponding to the upper limit voltage $V_{max}$ is defined as an available electric potential range $\Delta V_c$ of the positive electrode. In the electric potential of the negative electrode under the predetermined condition of charge, a range between an electric potential corresponding to the lower limit voltage $V_{min}$ and an electric potential corresponding to the upper limit voltage $V_{max}$ is defined as an available potential range $\Delta V_a$ of the negative electrode. The lithium concentration in each of the positive electrode and the negative electrode varies in accordance with the charge amount (SOC) of the battery 5. Hereinafter, the lithium concentration in the positive electrode at a charge amount Y is referred to as $C_{c,Y}$, and the lithium concentration in the negative electrode at the charge amount Y is referred to as $C_{a,Y}$. Furthermore, the lithium concentration in the positive electrode in a full-charge state, namely, the upper-limit charge amount of the positive electrode, is referred as $C_{c,max}$. The lithium concentration in the negative electrode in a full-charge state, namely, the upper-limit charge amount of the negative electrode is referred as $C_{a,max}$.

When the battery 5 deteriorate through use, at least one of the capacity of the positive electrode and the capacity of the negative electrode in the battery 5 is reduced. As the battery 5 deteriorates, the lithium concentration $C_{c,Y}$ in the positive electrode at the charge amount Y, the lithium concentration $C_{a,Y}$ in the negative electrode at the charge amount Y, etc., change from those at the beginning of use of the battery 5. Furthermore, as the battery 5 deteriorates, the initial charge amount of the negative electrode, the initial discharge amount of the positive electrode, the SOW, and the available electric potential range of each of the positive electrode and the negative electrode also change from those at the beginning of use. Therefore, when the battery 5 is used, it is important to periodically and appropriately estimate the internal states of the battery 5.

In another example, the internal state parameters may be defined based on changes in open circuit electric potentials (OCP) of the positive electrode and the negative electrode, which are electric potential variations of the positive electrode and the negative electrode in a state where the lithium concentration distribution at each of the positive electrode and the negative electrode is steady, instead of the electric potential variations of the positive electrode and the negative electrode under the predetermined condition of charge as described above. However, in a state where the lithium concentration distribution at each of the positive electrode and the negative electrode is steady or quasi-steady, for example, at the time of charging with the first electric current, the electric potential variation of the positive electrode is substantially the same as the variation of the open circuit electric potential of the positive electrode, and the electric potential variation of the negative electrode is substantially the same as the variation of the open circuit electric potential of the negative electrode. In the following description, it is assumed that the internal state parameters are defined based on electric potential variations of the positive electrode and the negative electrode at the time of charging with the first electric current, which is a state where the lithium concentration distribution in each of the positive electrode and the negative electrode is steady or quasi-steady.

At the time of charging of the battery 5, based on the Butler-Volmer equation, the electric current $I_c$ flowing through the positive electrode is expressed as formula (1-A), and the electric current $I_a$ flowing through the negative electrode is expressed as formula (1-B). Formula (1-A) indicates a capacity $w_c$ of the positive electrode, a lithium concentration $C_{c,s}$ at an interface between an electrolyte and the active material of the positive electrode, and a lithium concentration $C_{c,max}$ of the positive electrode in the full-charge state of the positive electrode described above.

Formula (1-B) indicates a capacity $w_a$ of the negative electrode, a lithium concentration $C_{a,s}$ at an interface between an electrolyte and the active material of the negative electrode, and a lithium concentration $C_{a,max}$ of the negative electrode in the full-charge state of the negative electrode described above. Further, in formula (1-A), $\eta_c$ represents an overvoltage with respect to the open circuit electric potential in the positive electrode. In formula (1-B), $\eta_a$ represents an overvoltage with respect to the open circuit electric potential in the negative electrode. In formula (1-A) and formula (1-B), $C_e$ represents a concentration of an electrolyte, $\beta$ represents a reaction multiplier, and k represents a constant based on the Butler-Volmer equation. Formula (1-A) expresses an interfacial reaction between the active material surface and the electrolyte of the positive electrode. However, in a steady or quasi-steady state in which the lithium concentration $C_{c,s}$ at the active material surface (interface with the electrolyte of the active material) is the same or substantially the same as an average lithium concentration $c_c$ in the positive electrode, formula (1-A) can be expressed as formula (1-C). Similarly, formula (1-B) expresses an interfacial reaction between the active material surface and the electrolyte of the negative electrode. However, in a steady or quasi-steady state in which the lithium concentration $C_{a,s}$ at the active material surface (interface between the electrolyte and the active material) is the same or substantially the same as an average lithium concentration $c_a$ in the negative electrode, formula (1-B) can be expressed as formula (1-D).

$$I_c = kw_c(C_{c,max}-C_{c,s})^{0.5}(C_{c,s})^{0.5}(C_e)^{0.5}\{\exp(\beta\eta_c)-\exp(-\beta\eta_c)\} \quad (1\text{-A})$$

$$I_a = kw_a(C_{a,max}-C_{a,s})^{0.5}(C_{a,s})^{0.5}(C_e)^{0.5}\{\exp(\beta\eta_a)-\exp(-\beta\eta_a)\} \quad (1\text{-B})$$

$$I_c = kw_c(C_{c,max}-C_c)^{0.5}(C_c)^{0.5}(C_e)^{0.5}\{\exp(\beta\eta_c)-\exp(-\beta\eta_c)\} \quad (1\text{-C})$$

$$I_a = kw_a(C_{a,max}-C_a)^{0.5}(C_a)^{0.5}(C_e)^{0.5}\{\exp(\beta\eta_a)-\exp(-\beta\eta_a)\} \quad (1\text{-D})$$

In a state where the lithium concentration distribution in each of the positive electrode and the negative electrode when the battery 5 is charged with the first electric current is steady or quasi-steady, an impedance $R_{c,Y}$ of the positive electrode at the charge amount Y is expressed as formula (2-A) using formula (1-C). Similarly, in the steady or quasi-steady state mentioned above, an impedance $R_{a,Y}$ of the negative electrode at the charge amount Y is expressed as formula (2-B) using formula (1-D). Based on formula (2-A) and formula (2-B), in each of the positive electrode and the negative electrode, the more the capacity (reaction area) decreases, the more the impedance increases. Furthermore, in each of the positive electrode and the negative electrode, the more the lithium concentration decreases, the more the impedance increases.

$$R_{c,Y} \approx 1/(kw_c(C_{c,max}-C_{c,Y})^{0.5}(C_{c,Y})^{0.5}(C_e)^{0.5}) \quad (2\text{-A})$$

$$R_{a,Y} \approx 1/(kw_a(C_{a,max}-C_{a,Y})^{0.5}(C_{a,Y})^{0.5}(C_e)^{0.5}) \quad (2\text{-B})$$

In the estimation of the internal states of the battery 5, the internal state estimation unit 13 performs a fitting calculation using the measurement result of an impedance $R_c 1$ of the positive electrode at the time of charging with the first electric current, and the relation of an impedance $R_c$ to the capacity $w_c$ and the lithium concentration $C_c$ in the positive electrode expressed by formula (2-A). In other words, a fitting calculation to apply the calculation result of formula (2-A) to the measurement result of the impedance $R_c 1$ of the positive electrode is performed. At this time, a fitting calculation is performed to obtain a variable, using the capacity $w_c$ and the lithium concentration $C_c$ in the positive electrode as variables. Accordingly, the capacity $w_c$ and the lithium concentration $C_c$ in the positive electrode are estimated as internal state parameters.

Furthermore, in the estimation of the internal states of the battery 5, the internal state estimation unit 13 performs a fitting calculation using the measurement result of an impedance $R_a 1$ of the negative electrode at the time of charging with the first electric current, and the relation of an impedance $R_a$ to the capacity $w_a$ and the lithium concentration $C_a$ in the negative electrode expressed by formula (2-B). In other words, a fitting calculation to apply the calculation result of formula (2-B) to the measurement result of the impedance $R_a 1$ of the negative electrode is performed. At this time, a fitting calculation is performed to obtain a variable, using the capacity $w_a$ and the lithium concentration $C_a$ in the negative electrode as variables. Accordingly, the capacity $w_a$ and the lithium concentration $C_a$ in the negative electrode are estimated as internal state parameters.

As described above, in a steady or quasi-steady state of the lithium concentration distribution in the positive electrode at the time of charging with the first electric current, the lithium concentration at the active material surface of the positive electrode is the same or substantially the same as the average lithium concentration in the active material of the positive electrode. Therefore, the capacity $w_c$ and the lithium concentration $C_c$ in the positive electrode are suitably estimated through the fitting calculation using formula (2-A). Then, in a steady or quasi-steady state of the lithium concentration distribution in the negative electrode, the lithium concentration at the active material surface of the negative electrode is the same or substantially the same as the average lithium concentration in the active material of the negative electrode. Therefore, the capacity $w_a$ and the lithium concentration Ca in the negative electrode are suitably estimated through the fitting calculation using formula (2-B).

The data storage unit 16 stores data for calculating an electric potential $V_c$ of the positive electrode in the steady or quasi-steady state using at least the charge amount and the lithium ion concentration $C_c$ in the positive electrode. The data for calculating the electric potential $V_C$ of the positive electrode in the steady or quasi-steady state corresponds to data indicative of the relation of the lithium concentration $C_c$ in the positive electrode to the electric potential $V_c$ of the positive electrode in the steady or quasi-steady state at the time of charging with the first electric current. The internal state estimation unit 13 calculates an electric potential $V_c 1$ of the positive electrode at the time of charging with the first electric current using at least the estimated lithium concentration $C_c$ in the positive electrode and the data for calculating the electric potential $V_c$ of the positive electrode in the steady or quasi-steady state. Accordingly, an electric potential curve indicative of the relation of the electric potential $V_c 1$ of the positive electrode to the charge amount at the time of charging with the first electric current is estimated.

Furthermore, the data storage unit 16 stores data for calculating an electric potential $V_a$ of the negative electrode in the steady or quasi-steady state using at least the charge amount and the lithium ion concentration $C_a$ in the negative electrode. The data for calculating the electric potential $V_a$ of the negative electrode in the steady or quasi-steady state corresponds to data indicative of the relation of the lithium concentration $C_a$ in the negative electrode to the electric potential $V_a$ of the negative electrode in the steady or quasi-steady state at the time of charging with the first electric current. The internal state estimation unit 13 calculates an electric potential $V_a 1$ of the negative electrode at the time of charging with the first electric current using at least the estimated lithium concentration $C_a$ in the negative electrode and the data for calculating the electric potential $V_a$ of the negative electrode in the steady or quasi-steady state. Accordingly, an electric potential curve indicative of the relation of the electric potential $V_a 1$ of the negative electrode to the charge amount at the time of charging with the first electric current is estimated.

By estimating the electric potential curve of each of the positive electrode and the negative electrode in the steady or quasi-steady state at the time of charging with the first electric current as described above, the internal state estimation unit 13 can estimate the initial charge amount in the negative electrode, the initial discharge amount in the positive electrode and the SOW as internal state parameters. In addition, the internal state estimation unit 13 estimates the battery capacity $w_{\textit{eff}}$ of the battery 5 based on the internal state parameters estimated as described above, a change in voltage of the battery 5 at the time of charging with the first electric current, etc. The internal state estimation unit 13 estimates an available electric potential range $\Delta V_c$ of the positive electrode as an internal state parameter based on the estimated battery capacity $w_{\textit{eff}}$, the electric potential curve of the positive electrode at the time of charging with the first electric current, etc. Similarly, the internal state estimation unit 13 estimates an available electric potential range $\Delta V_a$ of the negative electrode as an internal state parameter based on the estimated battery capacity $w_{\textit{eff}}$, the electric potential curve of the negative electrode at the time of charging with the first electric current, etc. The internal state estimation unit 13 writes and stores in the data storage unit 16 the estimation result for the internal states of the battery 5 estimated at the time of charging with the first electric current.

Furthermore, in the present embodiment, the internal states of the battery 5 can be estimated by the processing in the internal state estimation unit 13 and the correction coefficient arithmetic unit 15 based on the impedance of each of the positive electrode and the negative electrode at the time of charging with the second electric current. However, when the battery 5 is charged with the second electric current, since the battery 5 is rapidly charged at a high charging rate as described above, diffusion of lithium ions will be a rate-limiting factor in at least one of the positive electrode and the negative electrode. Therefore, at the time of charging with the second electric current, the lithium concentration in each of the active material particles will be non-uniform in at least one of the positive electrode and the negative electrode, and the lithium concentration at the active material surface differs from the average lithium concentration in the active material in at least one of the positive electrode and the negative electrode. For example, in rapid charging at a high charging rate, in at least one of the positive electrode and the negative electrode, the lithium concentration in the active material particle surface is higher than the lithium concentration inside the active material particle.

Therefore, at the time of charging with the second electric current, the lithium concentration distribution in at least one of the positive electrode and the negative electrode will be unsteady. In other words, at the time of charging with the second electric current, the lithium concentration distribution in at least one of the positive electrode and the negative electrode is different from that in the steady or quasi-steady state of the lithium concentration distribution in each of the positive electrode and the negative electrode at the time of charging with the first electric current. In a battery using rough lithium titanate as the negative electrode active material, the lithium concentration distribution is increased and tends to be in an unsteady state in at least the negative electrode at the time of charging at a high charging rate. On the other hand, in a battery using a fine lithium titanate as the negative electrode active material, the lithium concentration distribution is increased and tends to be in an unsteady state in at least the positive electrode at the time of charging at a high charging rate.

In a state where the lithium concentration is non-uniform in the positive electrode, namely, in a state where the lithium concentration distribution in the positive electrode is unsteady, formula (1-A) is not equivalent to formula (1-C). Thus, the capacity $w_c$ and the lithium concentration $C_c$ in the positive electrode cannot be calculated as suitable values through the fitting calculation using formula (2-A) described above. Therefore, when the internal states of the battery 5 are estimated based on the impedance $R_c$ of the positive electrode in the state where the lithium concentration distribution in the positive electrode is unsteady, it is necessary to correct an influence resulting from the non-uniformity of the lithium concentration in the positive electrode (an influence resulting from the lithium ion diffusion in the positive electrode as a rate-limiting factor), and to estimate average concentration information inside the active material from concentration information at an interface between the active material and the electrolyte. In other words, it is necessary to correct the unsteady factor regarding the lithium concentration distribution in the positive electrode to estimate the internal states.

Similarly, in a state where the lithium concentration is non-uniform in the negative electrode, namely, in a state where the lithium concentration distribution in the negative electrode is unsteady, formula (1-B) is not equivalent to formula (1-D). Thus, the capacity $w_a$ and the lithium concentration $C_a$ in the negative electrode cannot be calculated as suitable values through the fitting calculation using formula (2-B). Therefore, when the internal states of the battery 5 are estimated based on the impedance $R_a$ of the negative electrode in the state where the lithium concentration distribution in the negative electrode is unsteady, it is necessary to correct an influence resulting from the non-uniformity of the lithium concentration in the negative electrode (an influence resulting from the lithium ion diffusion in the negative electrode as a rate-limiting factor), and to estimate average concentration information inside the active material from concentration information at an interface between the active material and the electrolyte. In other words, it is necessary to correct the unsteady factor regarding the lithium concentration distribution in the negative electrode to estimate the internal states.

In the present embodiment, the correction coefficient arithmetic unit 15 acquires the impedance of the battery 5 measured at each of the charge amounts at the time of charging with the second electric current, and the impedance of each of the positive electrode and the negative electrode measured at each of the charge amounts at the time of charging with the second electric current. The correction coefficient arithmetic unit 15 also acquires, as an estimation result of the internal state estimation unit 13, the relation of the electric potential of each of the positive electrode and the negative electrode to the charge amount at the time of charging with the first electric current, namely, the electric potential curve of each of the positive electrode and the negative electrode at the time of charging with the first electric current. Furthermore, the correction coefficient arithmetic unit 15 acquires the measurement result of a voltage V1 of the battery 5 at the time of charging with the first electric current, and the measurement result of a voltage V2 of the battery 5 at the time of charging with the second electric current.

When an influence resulting from the non-uniformity of the lithium concentration in the positive electrode is to be corrected, the correction coefficient arithmetic unit 15 estimates an electric potential curve of the positive electrode at the time of charging with the second electric current based on the electric potential curve of the positive electrode at the time of charging with the first electric current and an impedance $R_c2$ of the positive electrode and an impedance $R_a2$ of the negative electrode at the time of charging with the second electric current. In other words, the correction coefficient arithmetic unit 15 estimates an electric potential of the positive electrode at each of the charge amounts (SOC) relating to time of charging with the second electric current. At this time, an electric potential $V_c2$ of the positive electrode at the time of charging with the second electric current is calculated based on formula (3-A) using the impedances $R_c2$ and $R_a2$, the voltages V1 and V2, and the electric potential $V_c1$ of the positive electrode at the time of charging with the first electric current. The electric potential curve of the positive electrode at the time of charging with the second electric current indicates the relation of the electric potential of the positive electrode to the charge amount at the time of charging with the second electric current.

When an influence resulting from the non-uniformity of the lithium concentration in the negative electrode is to be corrected, the correction coefficient arithmetic unit 15 estimates an electric potential curve of the negative electrode at the time of charging with the second electric current based on the electric potential curve of the negative electrode at the time of charging with the first electric current and an impedance $R_c2$ of the positive electrode and an impedance $R_a2$ of the negative electrode at the time of charging with the second electric current. In other words, the correction coefficient arithmetic unit 15 estimates an electric potential of the negative electrode at each of the charge amounts (SOC) relating to time of charging with the second electric current. At this time, an electric potential $V_a2$ of the negative electrode at the time of charging with the second electric current is calculated based on formula (3-B) using the impedances $R_c2$ and $R_a2$, the voltages V1 and V2, and the electric potential $V_a1$ of the negative electrode at the time of charging with the first electric current. The electric potential curve of the negative electrode at the time of charging with the second electric current indicates the relation of the electric potential of the negative electrode to the charge amount at the time of charging with the second electric current.

$$V_c2 = V_c1 + (V2 - V1) \times (R_c2/(R_c2 + R_a2)) \quad (3\text{-A})$$

$$V_a2 = V_a1 - (V2 - V1) \times (R_a2/(R_c2 + R_a2)) \quad (3\text{-B})$$

The correction coefficient arithmetic unit 15 corrects the difference between a lithium concentration distribution in the positive electrode (target electrode) at the time of charging with the first electric current, which is the steady or quasi-steady state, and a lithium concentration distribution in the positive electrode (target electrode) at the time of charging with the second electric current, which is the unsteady state, based on the difference between the electric potential (the aforementioned electric potential curve) of the positive electrode at the time of charging with the first electric current and the electric potential (the aforementioned electric potential curve) of the positive electrode at the time of charging with the second electric current, and the impedance $R_c2$ of the positive electrode at the time of charging with the second electric current. At this time, the correction coefficient arithmetic unit 15 estimates a correction coefficient $\Delta C_c$ as a parameter to correct the difference between the lithium concentration distribution in the positive electrode at the time of charging with the first electric current and the lithium concentration distribution in the positive electrode at the time of charging with the second electric current. The correction coefficient $\Delta C_c$ is a parameter to correct an influence resulting from the non-uniformity of the lithium concentration in the positive electrode (target electrode) at the time of charging with the second electric current, namely, an influence resulting from the lithium ion diffusion in the negative electrode as a rate-limiting factor at the time of charging with the second electric current.

Furthermore, the correction coefficient arithmetic unit 15 corrects the difference between a lithium concentration distribution in the negative electrode (target electrode) at the time of charging with the first electric current, which is the steady or quasi-steady state, and a lithium concentration distribution in the negative electrode (target electrode) at the time of charging with the second electric current, which is the unsteady state, based on the difference between the electric potential (the aforementioned electric potential curve) of the negative electrode at the time of charging with the first electric current and the electric potential (the aforementioned electric potential curve) of the negative electrode at the time of charging with the second electric current, and the impedance $R_a2$ of the negative electrode at the time of charging with the second electric current. At this time, the correction coefficient arithmetic unit 15 estimates a correction coefficient $\Delta C_a$ as a parameter to correct the difference between the lithium concentration distribution in the negative electrode at the time of charging with the first electric current and the lithium concentration distribution in the negative electrode at the time of charging with the second electric current. The correction coefficient $\Delta C_a$ is a parameter to correct an influence resulting from the non-uniformity of the lithium concentration in the negative electrode (target electrode) at the time of charging with the second electric current, namely, an influence resulting from the lithium ion diffusion in the negative electrode as a rate-limiting factor at the time of charging with the second electric current. The correction coefficients $\Delta C_c$ and $\Delta C_a$ are estimated for each of the charge amounts at which the impedances $R_c2$ and $R_a2$ are measured at the time of charging with the second electric current.

Figure 5:
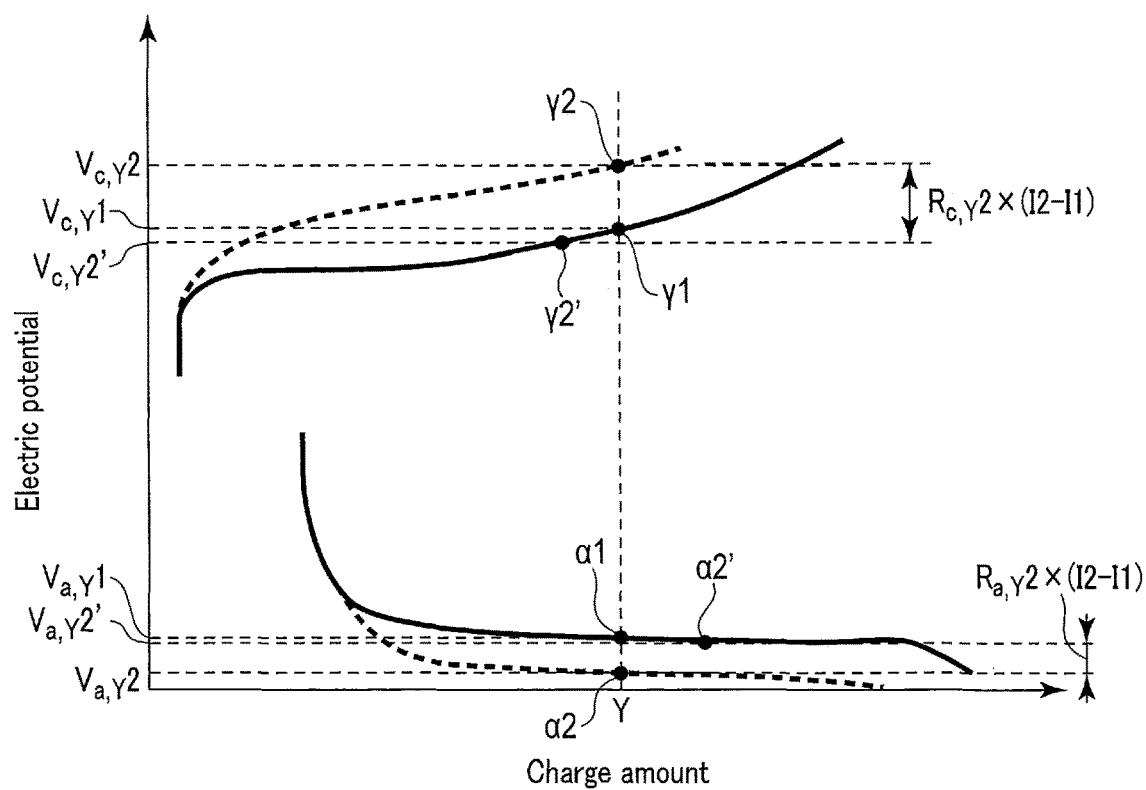
FIG. 5 is a schematic diagram for explaining a process of estimating a correction coefficient to correct a difference between a lithium concentration distribution in the positive electrode at a time of charging with a first electric current and a lithium concentration distribution in the positive electrode at a time of charging with a second electric current, and a correction coefficient to correct a difference between a lithium concentration distribution in the negative electrode at the time of charging with the first electric current and a lithium concentration distribution in the negative electrode at the time of charging with the second electric current according to the first embodiment.

FIG. 5 is a schematic diagram for explaining a process of estimating a correction coefficient to correct a difference between a lithium concentration distribution in the positive electrode at the time of charging with a first electric current and a lithium concentration distribution in the positive electrode at the time of charging with the second electric current, and a correction coefficient to correct a difference between a lithium concentration distribution in the negative electrode at the time of charging with the first electric current and a lithium concentration distribution in the negative electrode at the time of charging with the second electric current according to the first embodiment. In FIG. 5, the abscissa axis represents a charge amount, and the ordinate axis represents an electric potential. In FIG. 5, the electric potential curves of the positive electrode and the negative electrode at the time of charging with the first electric current are indicated by solid lines, and the electric potential curves of the positive electrode and the negative electrode at the time of charging with the second electric current are indicated by broken lines.

When the correction coefficient $\Delta C_c$ for the positive electrode is estimated, the correction coefficient arithmetic unit 15 calculates a multiplication value obtained by multiplying a difference value between the second electric current and the first electric current (I2−I1) by the impedance $R_c2$ of the positive electrode at the time of charging with the second electric current for each of the charge amounts at which the impedance $R_c2$ of the positive electrode is measured at the time of charging with the second electric current. Then, the correction coefficient arithmetic unit 15 defines the calculated multiplication value ($R_c2 \times (I2-I1)$) as an overvoltage at the positive electrode at the time of charging with the second electric current relative to the time of charging with the first electric current, and calculates an electric potential (second electric potential) $V_c2'$ obtained by removing the overvoltage element from the electric potential (first electric potential) $V_c2$ of the positive electrode at the time of charging with the second electric current. The electric potential $V_c2'$ obtained by removing the overvoltage element from the electric potential of the positive electrode is calculated using formula (4-A). In FIG. 5, the electric potential at the positive electrode at the time of charging with the second electric current at the charge amount Y is $V_{c,y}2$ (refer to a point γ2), and becomes an electric potential $V_{c,y}2'$ (refer to a point γ2') by removing the overvoltage element ($R_{c,y}2 \times (I2-I1)$) from the electric potential $V_{c,y}2$.

When the correction coefficient $\Delta C_a$ for the negative electrode is estimated, the correction coefficient arithmetic unit 15 calculates a multiplication value obtained by multiplying a difference value between the second electric current and the first electric current (I2−I1) by the impedance $R_a2$ of the negative electrode at the time of charging with the second electric current for each of the charge amounts at which the impedance $R_a2$ of the negative electrode is measured at the time of charging with the second electric current. Then, the correction coefficient arithmetic unit 15 defines the calculated multiplication value ($R_a 2 \times (I2-I1)$) as an overvoltage at the negative electrode at the time of charging with the second electric current relative to the time of charging with the first electric current, and calculates an electric potential (second electric potential) $V_a2'$ obtained by removing the overvoltage element from the electric potential (first electric potential) $V_a2$ of the negative electrode at the time of charging with the second electric current. The electric potential $V_a2'$ obtained by removing the overvoltage element from the electric potential of the negative electrode is calculated using formula (4-B). In FIG. 5, the electric potential at the negative electrode at the time of charging with the second electric current at the charge amount Y is $V_{a,y}2$ (refer to a point α2), and becomes an electric potential $V_{a,y}2'$ (refer to a point α2') by removing the overvoltage element ($R_{a,y}2 \times (I2-I1)$) from the electric potential $V_{a,y}2$.

$$V_c2' = V_c2 - R_c2 \times (I2-I1) \quad (4\text{-}A)$$

$$V_a2' = V_a2 + R_a2 \times (I2-I1) \quad (4\text{-}B)$$

When the correction coefficient $\Delta C_c$ for the positive electrode is estimated, the correction coefficient arithmetic unit 15 calculates an electric potential (third electric potential) $V_c1$ at which the charge amount is the same as that of the electric potential (first electric potential) $V_c2$ on the electric potential curve of the positive electrode at the time of charging with the first electric current for each of the charge amounts at which the impedance $R_c2$ of the positive electrode is measured at the time of charging with the second electric current. In the example shown in FIG. 5, on the electric potential curve of the positive electrode at the time of charging with the first electric current, the charge amount Y at the electric potential $V_{c,y}1$ (refer to a point γ1) is the same as that at the electric potential $V_{c,y}2$. The correction coefficient arithmetic unit 15 calculates the correction coefficient $\Delta C_c$ for the positive electrode based on the difference between the electric potential (second electric potential) $V_c2'$ and the electric potential (third electric potential) $V_c1$, and the aforementioned data indicative of the relation of the lithium concentration $C_c$ to the electric potential of the positive electrode at the time of charging with the first electric current (steady or quasi-steady state). The correction coefficient $\Delta C_c$ for the positive electrode corresponds to a difference value between the lithium concentration in the positive electrode at the electric potential (second potential) $V_c2'$ and the lithium concentration in the positive electrode at the electric potential (third potential) $V_c1$ at the time of charging with the first electric current. In the example shown in FIG. 5, the difference value between the lithium concentration in the positive electrode at a point γ2' and the lithium concentration in the positive electrode at a point γ1 becomes a correction coefficient $\Delta C_{c,y}$ for the positive electrode at the charge amount Y.

When the correction coefficient $\Delta C_a$ for the negative electrode is estimated, the correction coefficient arithmetic unit 15 calculates an electric potential (third electric potential) $V_a1$ at which the charge amount is the same as that of the electric potential (first electric potential) $V_a2$ on the electric potential curve of the negative electrode at the time of charging with the first electric current for each of the charge amounts at which the impedance $R_a2$ of the negative electrode is measured at the time of charging with the second electric current. In the example shown in FIG. 5, on the electric potential curve of the negative electrode at the time of charging with the first electric current, the charge amount Y at the electric potential $V_{a,y}1$ (refer to a point α1) is the same as that at the electric potential $V_{a,y}2$. The correction coefficient arithmetic unit 15 calculates the correction coefficient $\Delta C_a$ for the negative electrode based on the difference between the electric potential (second electric potential) $V_{a,y}2'$ and the electric potential (third electric potential) $V_a1$, and the aforementioned data indicative of the relation of the lithium concentration $C_a$ in the negative electrode to the electric potential of the negative electrode at the time of charging with the first electric current (steady or quasi-steady state). The correction coefficient $\Delta C_a$ for the negative electrode corresponds to a difference value between the lithium concentration in the negative electrode at the electric potential (second electric potential) $V_a2'$ and the lithium concentration in the negative electrode at the electric potential (third electric potential) $V_a1$ at the time of charging with the first electric current. In the example shown in FIG. 5, the difference value between the lithium concentration in the negative electrode at a point α2' and the lithium concentration in the negative electrode at a point α1 becomes a correction coefficient $\Delta C_{a,y}$ for the negative electrode at the charge amount Y.

As described above, the correction coefficient arithmetic unit 15 estimates the correction coefficients $\Delta C_c$ and $\Delta C_a$ for each of the charge amounts at which the impedances $R_c2$ and $R_a2$ are measured at the time of charging with the second electric current. The correction coefficient arithmetic unit 15 writes the estimation results for the correction coefficients $\Delta C_c$ and $\Delta C_a$ in the data storage unit 16, and stores the estimated correction coefficients $\Delta C_c$ and $\Delta C_a$ in the data storage unit 16.

In the estimation of an internal state of the battery 5 at the time of charging with the second electric current, the internal state estimation unit 13 acquires the impedance of each of the positive electrode and the negative electrode measured at each of the charge amounts at the time of charging with the second current, and also acquires estimation results for the correction coefficients $\Delta C_c$ and $\Delta C_a$ in the correction coefficient arithmetic unit 15. The internal state estimation unit 13 estimates an internal state of the battery 5 based on the impedance of each of the positive electrode and the negative electrode at the time of charging with the second electric current, and the estimated correction coefficients $\Delta C_c$ and $\Delta C_a$. Also in the estimation of an internal state of the battery 5 at the time of charging with the second electric current, the internal state estimation unit 13 estimates, as internal state parameters, the capacity $w_c$ of the positive electrode, the lithium concentration $C_c$ in the positive electrode, the capacity $w_a$ of the negative electrode, and the lithium concentration $C_a$ in the negative electrode.

If the lithium concentration distribution in the positive electrode becomes unstable by the charging with the second electric current, the capacity $w_c$ and the lithium concentration $C_c$ in the positive electrode cannot be calculated as suitable values through the aforementioned fitting calculation using formula (2-A). Therefore, in the estimation of an internal state of the battery 5 at the time of charging with the second electric current, formula (5-A) and formula (5-B) are used instead of formula (2-A). The internal state estimation unit 13 performs a fitting calculation using the measurement result of an impedance $R_c2$ of the positive electrode at the time of charging with the second electric current, the estimation result of the correction coefficient $\Delta C_c$ for the lithium concentration distribution in the positive electrode, and the relation of the impedance $R_c$ to the capacity $w_c$, the lithium concentration $C_c$ in the positive electrode, and the correction coefficient $\Delta C_c$ in the positive electrode expressed by formula (5-A) and formula (5-B). In other words, a fitting calculation to apply the result of calculation, in which the estimated correction coefficient $\Delta C_c$ is substituted into formula (5-A) and formula (5-B), to the measurement result of the impedance $R_c2$ of the positive electrode is performed. At this time, a fitting calculation is performed to obtain a variable, using the capacity $w_c$ and the lithium concentration $C_c$ in the positive electrode as variables. Accordingly, the capacity $w_c$ and the lithium concentration $C_c$ in the positive electrode are estimated as internal state parameters.

Substitution of formula (5-B) into formula (5-A) results in formula (5-C). Thus, in the estimation of the internal state of the battery 5 at the time of charging with the second electric current, the internal state estimation unit 13 performs a fitting calculation using the relation expressed by formula (5-C), thereby estimating the capacity $w_c$ and the lithium concentration $C_c$ in the positive electrode. In formula (5-A) and formula (5-B), $C'_{c,y}$ is a provisional value before correction is performed with the correction coefficient $\Delta C_{c,y}$ concerning the lithium concentration in the positive electrode at the charge amount Y. The provisional value $C'_{c,y}$ corresponds to a lithium concentration in an area in which the lithium concentration is comparatively high in the positive electrode in the unsteady state where the lithium concentration is non-uniform. For example, the provisional value $C'_{c,y}$ corresponds to a lithium concentration in a surface of the active material in the positive electrode in the unsteady state. In this case, the correction coefficient $\Delta C_c$ corresponds to a difference between the lithium concentration in a surface of the active material in the positive electrode in the steady or quasi-steady state and the lithium concentration in the surface of the active material in the positive electrode in the unsteady state. In the estimation of the capacity $w_e$ and the lithium concentration $C_c$ in the positive electrode through the fitting calculation using formula (5-C), an influence of the distribution of a concentration $C_e$ of the electrolyte is ignored. In a temperature environment in which a rapid charging at a high charging rate is possible, namely, in a temperature range higher than room temperature, a lithium diffusion coefficient in an electrolyte has a greater number of digits than that of a lithium diffusion coefficient in an active material in each of the positive electrode and the negative electrode. Therefore, in a rapid charging at a high charging rate, the lithium concentration distribution in the active material in either the positive electrode or the negative electrode is predominant relative to the concentration distribution of the electrolyte. Thus, the concentration of the electrolyte can be ignored.

$$R_{c,Y} \approx 1/(kw_c(C_{c,max}-C'_{c,Y})^{0.5}(C'_{c,Y})^{0.5}) \tag{5-A}$$

$$C'_{c,Y}=C_{c,Y}+\Delta C_{c,Y} \tag{5-B}$$

$$R_{c,Y} \approx 1/(kw_c(C_{c,max}-(C_{c,Y}+\Delta C_{c,Y}))^{0.5}(C_{c,Y}+\Delta C_{c,Y})^{0.5}) \tag{5-C}$$

If the lithium concentration distribution in the negative electrode becomes unstable due to charging with the second electric current, the capacity $w_a$ and the lithium concentration $C_a$ in the negative electrode cannot be calculated as suitable values through the aforementioned fitting calculation using formula (2-B). Therefore, in the estimation of an internal state of the battery 5 at the time of charging with the second electric current, formula (6-A) and formula (6-B) are used instead of formula (2-B). The internal state estimation unit 13 performs a fitting calculation using the measurement result of an impedance $R_a 2$ of the negative electrode at the time of charging with the second electric current, the estimation result of the correction coefficient $\Delta C_a$ for the lithium concentration distribution in the negative electrode, and the relation of the impedance $R_a$ to the capacity $w_a$, the lithium concentration $C_a$ in the negative electrode, and the correction coefficient $\Delta C_a$ in the negative electrode expressed by formula (6-A) and formula (6-B). In other words, a fitting calculation to apply the result of calculation, in which the estimated correction coefficient $\Delta C_a$ is substituted into formula (6-A) and formula (6-B), to the measurement result of the impedance $R_a 2$ of the negative electrode is performed. At this time, a fitting calculation is performed to obtain a variable, using the capacity $w_a$ and the lithium concentration $C_a$ in the negative electrode as variables. Accordingly, the capacity $w_a$ and the lithium concentration $C_a$ in the negative electrode are estimated as internal state parameters.

Substitution of formula (6-B) into formula (6-A) results in formula (6-C). Thus, in the estimation of the internal state of the battery 5 at the time of charging with the second electric current, the internal state estimation unit 13 performs a fitting calculation using the relation expressed by formula (6-C), thereby estimating the capacity $w_a$ and the lithium concentration $C_a$ in the negative electrode. In formula (6-A) and formula (6-B), $C'_{a,Y}$ is a provisional value before correction is performed with the correction coefficient $\Delta C_{a,Y}$ concerning the lithium concentration in the negative electrode at the charge amount Y. The provisional value $C'_{a,Y}$ corresponds to a lithium concentration in an area in which the lithium concentration is comparatively high in the negative electrode in the unsteady state where the lithium concentration is non-uniform. For example, the provisional value $C'_{a,Y}$ corresponds to a lithium concentration in a surface of the active material in the positive electrode in the unsteady state. In this case, the correction coefficient $\Delta C_a$ corresponds to a difference between the lithium concentration in a surface of the active material in the negative electrode in the steady or quasi-steady state and the lithium concentration in the surface of the active material in the negative electrode in the unsteady state. In the estimation of the capacity $w_a$ and the lithium concentration $C_a$ in the negative electrode through the fitting calculation using formula (6-C), an influence of the distribution of a concentration $C_e$ of the electrolyte is ignored as described above.

$$R_{a,Y} \approx 1/(kw_a(C_{a,max}-C'_{a,Y})^{0.5}(C'_{a,Y})^{0.5}) \tag{6-A}$$

$$C'_{a,Y}=C_{a,Y}+\Delta C_{a,Y} \tag{6-B}$$

$$R_{a,Y} \approx 1/(kw_a(C_{a,max}-(C_{a,Y}+\Delta C_{a,Y}))^{0.5}(C_{a,Y}+\Delta C_{a,Y})^{0.5}) \tag{6-C}$$

In the present embodiment, even when the lithium concentration distribution in the positive electrode is unsteady due to charging with the second electric current or the like, a difference between a lithium concentration distribution in the positive electrode in the steady or quasi-steady state (for example, at the time of charging with the first electric current) and a lithium concentration distribution in the positive electrode in the unsteady state (for example, at the time of charging with the second electric current) is corrected by the correction coefficient $\Delta C_c$. Accordingly, even when the lithium concentration distribution in the positive electrode is unsteady, in estimating a capacity $w_c$ and a lithium concentration $C_c$, an influence resulting from the non-uniformity of the lithium concentration in the positive electrode is appropriately corrected, and the capacity $w_c$ and the lithium concentration $C_c$ are appropriately estimated through the aforementioned fitting calculation using the correction coefficient $\Delta C_c$ and formula (5-C).

Furthermore, in the present embodiment, even when the lithium concentration distribution in the negative electrode is unsteady due to charging with the second electric current or the like, a difference between a lithium concentration distribution in the negative electrode in the steady or quasi-steady state and a lithium concentration distribution in the negative electrode in the unsteady state is corrected by the correction coefficient $\Delta C_a$. Accordingly, even when the lithium concentration distribution in the negative electrode is unsteady, in estimating a capacity $w_a$ and a lithium concentration $C_c$, an influence resulting from the non-uniformity of the lithium concentration in the negative electrode is appropriately corrected, and the capacity $w_a$ and the lithium concentration $C_a$ are appropriately estimated through the aforementioned fitting calculation using the correction coefficient $\Delta C_a$ and formula (6-C).

When the capacities $W_c$ and $W_a$ and the lithium concentrations $C_c$ and $C_a$ are estimated as described above at the time of charging with the second electric current, the internal state estimation unit 13 estimates an electric potential curve (an electric potential variation with respect to a charge amount) of the electric potential $V_c$ of the positive electrode in the steady or quasi-steady state and an electric potential curve (an electric potential variation with respect to a charge amount) of the electric potential $V_a$ of the negative electrode in the steady or quasi-steady state in the same manner as in the estimation at the time of charging with the first electric current. The internal state estimation unit 13 can estimate the initial charge amount of the negative electrode, the initial discharge amount of the positive electrode and the SOW as internal state parameters, and can also estimate the available electric potential range $\Delta V_c$ of the positive electrode and the available electric potential range $\Delta V_a$ of the negative electrode in the same manner as in the estimation at the time of charging with the first electric current. The internal state estimation unit 13 writes and stores in the data storage unit 16 the estimation result for the internal states of the battery 5 estimated at the time of charging with the second electric current.

The calculation of the correction coefficient $\Delta C_c$ for the positive electrode is performed based on the electric potential variation of the electric potential $V_c$ of the positive electrode at the time of charging with the first electric current (in the steady or quasi-steady state) estimated in the charging with the first electric current as described above. The calculation of the correction coefficient $\Delta C_a$ for the negative electrode is performed based on the electric potential variation of the electric potential $V_a$ of the negative electrode at the time of charging with the first electric current (in the steady or quasi-steady state) estimated in the charging with the first electric current as described above. Therefore, as an electric potential curve of the positive electrode for use in calculation of the correction coefficient $\Delta C_c$ and an electric potential curve of the negative electrode for use in calculation of the correction coefficient $\Delta C_a$, the correction coefficients can be estimated more appropriately by using a curve for a shorter time from the estimation time to the current time.

In the present embodiment, at the time of charging with the second electric current, when the impedance of each of the positive electrode and the negative electrode is measured as described above, the processor or the like of the aging determination apparatus 3 acquires an elapsed time from the previous (most recent) estimation of the internal states of the battery 5 by the charging with the first electric current. If the elapsed time acquired is within a predetermined time period, the correction coefficient arithmetic unit 15 calculates at least one of the aforementioned correction coefficients $\Delta C_c$ and $\Delta C_a$, and the internal state estimation unit 13 estimates the internal states of the battery 5 including the capacities $W_c$ and $W_a$ and the lithium concentrations $C_c$ and $C_a$ as described above.

On the other hand, if the elapsed time acquired exceeds the predetermined time period, the processor or the like of the aging determination apparatus 3 measures the impedance of each of the positive electrode and the negative electrode at the time of charging with the second electric current, and thereafter finishes the charging with the second electric current without calculating the aforementioned correction coefficients $\Delta C_c$ and $\Delta C_a$. Then, the processor or the like of the aging determination apparatus 3 causes the battery 5 to be charged with the first electric current, measures the impedance of each of the positive electrode and the negative electrode in the state where the battery is charged with the first electric current as described above, and estimates the internal states of the battery 5. Accordingly, the estimation results for the electric potential variations of the positive electrode and the negative electrode at the time of charging with the first electric current (in the steady or quasi-steady state) are updated. In the subsequent estimations of the internal states of the battery 5 by the charging with the second electric current, the correction coefficients $\Delta C_c$ and $\Delta C_a$ are calculated using the updated estimation results as the electric potential variations of the positive electrode and the negative electrode at the time of charging with the first electric current.

Figure 6:
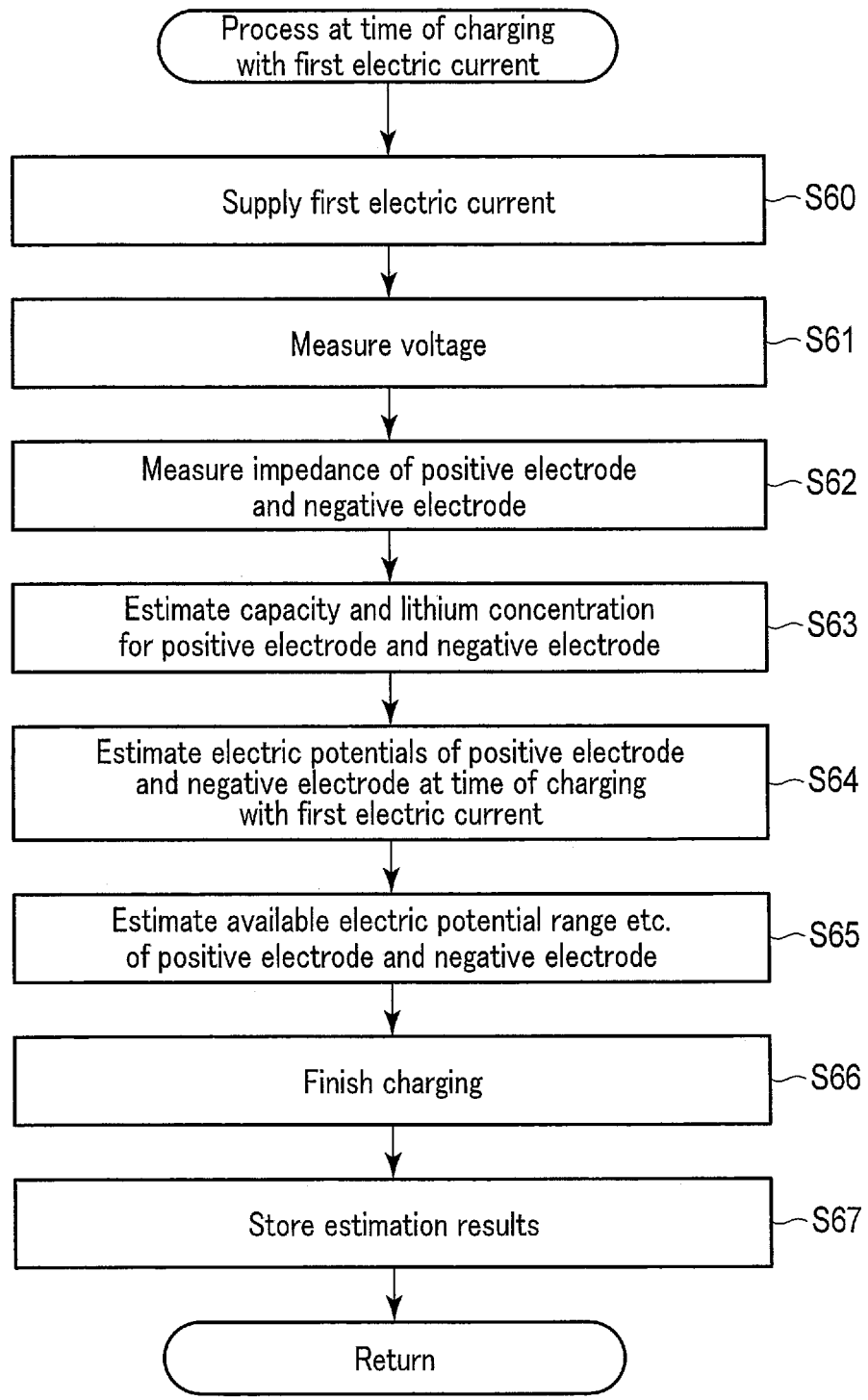
FIG. 6 is a flowchart illustrating a process at the time of charging with the first electric current executed by an aging determination apparatus according to the first embodiment.

FIG. 6 is a flowchart illustrating a process at the time of charging with the first electric current executed by the aging determination apparatus according to the first embodiment. The process illustrated in FIG. 6 is executed by the processor or the like of the aging determination apparatus 3 in the state where the battery 5 is charged with the first electric current. When the process illustrated in FIG. 6 is started, the processor or the like of the aging determination apparatus 3 supplies the first electric current to the battery 5, and charges the battery 5 (S60). The processor or the like of the aging determination apparatus 3 measures a voltage of the battery 5 and a time variation of the voltage at the time of charging with the first electric current, and acquires a measurement result for the voltage of the battery 5 (S61). Then, the impedance measurement unit 12 measures an impedance of each of the positive electrode and the negative electrode of the battery 5 at the time of charging with the first electric current as described above (S62).

The internal state estimation unit 13 estimates a capacity and a lithium concentration for each of the positive electrode and the negative electrode through the fitting calculation using formula (2-A), the fitting calculation using formula (2-B), etc. (S63). The internal state estimation unit 13 further estimates the electric potential of each of the positive electrode and the negative electrode at the time of charging with the first electric current (in the steady or quasi-steady state) as described above, based on the estimation results of the capacity and the lithium concentration in each of the positive electrode and the negative electrode (S64). As a result, the electric potential variations of the positive electrode and the negative electrode in the steady or quasi-steady state, such as the time of charging with the first electric current, are estimated. The internal state estimation unit 13 estimates the internal states including the available electric potential range of each of the positive electrode and the negative electrode based on the estimation results or the like of the electric potential variations of the positive electrode and the negative electrode (S65). The processor or the like of the aging determination apparatus 3 finishes the charging of the battery 5 (S66), and stores the estimation results for the internal states or the like (S67).

Figure 7:
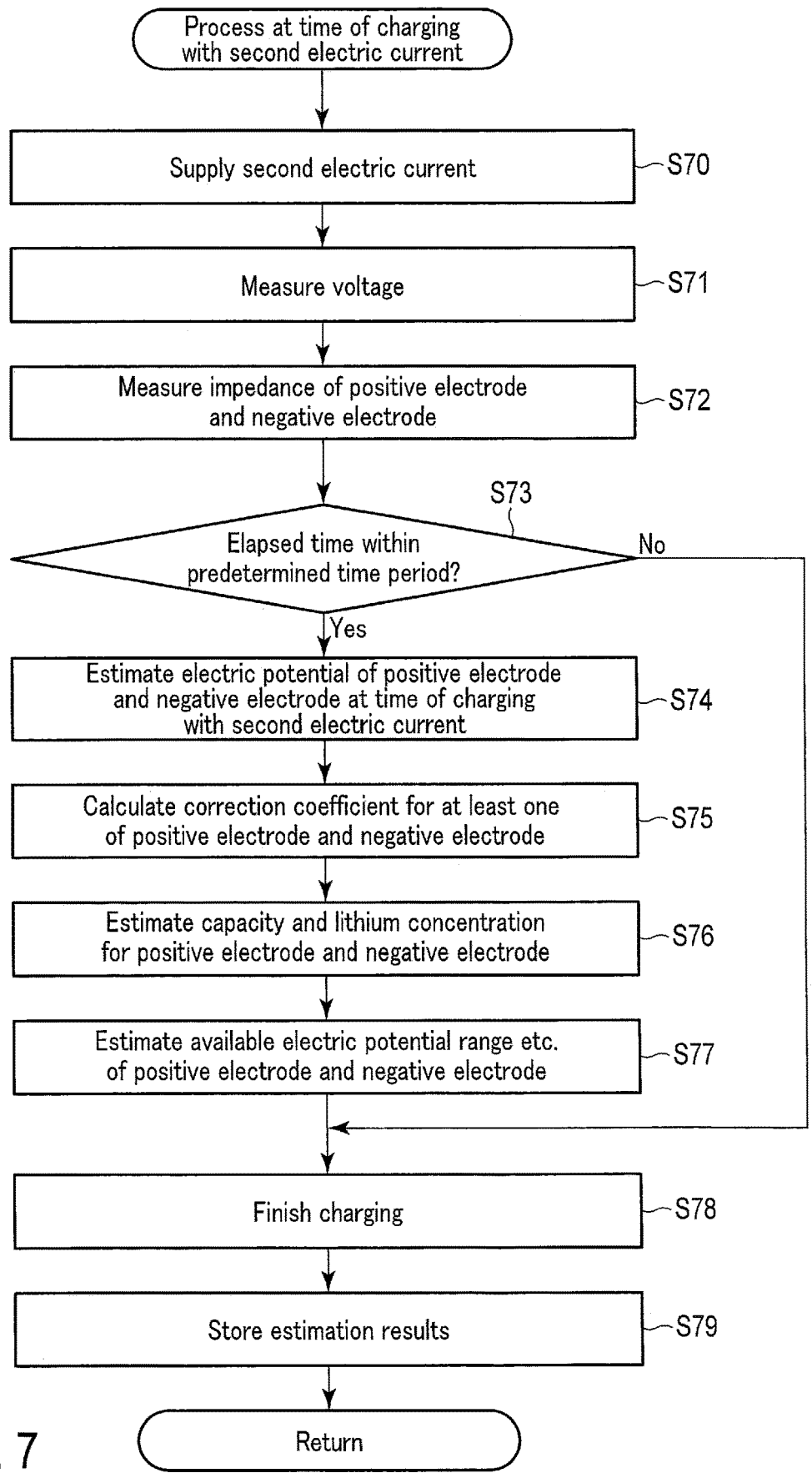
FIG. 7 is a flowchart illustrating a process at the time of charging with the second electric current executed by the aging determination apparatus according to the first embodiment.

FIG. 7 is a flowchart illustrating a process at the time of charging with the second electric current executed by the aging determination apparatus according to the first embodiment. The process illustrated in FIG. 7 is executed by the processor or the like of the aging determination apparatus 3 in the state where the battery 5 is charged with the second electric current. When the process illustrated in FIG. 7 is started, the processor or the like of the aging determination apparatus 3 supplies the second electric current to the battery 5, and charges the battery 5 (S70). The processor or the like of the aging determination apparatus 3 measures a voltage of the battery 5 and a time variation of the voltage at the time of charging with the second electric current, and acquires a measurement result for the voltage of the battery 5 (S71). Then, the impedance measurement unit 12 measures an impedance of each of the positive electrode and the negative electrode of the battery 5 at the time of charging with the second electric current as described above (S72).

Thereafter, the processor or the like of the aging determination apparatus 3 acquires an elapsed time from the previous (most recent) estimation of the internal states of the battery 5 by the charging with the first electric current, and determines whether the acquired elapsed time is within a predetermined time period (S73). If the elapsed time exceeds the predetermined time period (S73—No), the processor or the like of the aging determination apparatus 3 finishes the charging of the battery 5 (S78), and stores the estimation results including the measurement results of the impedances of the positive electrode and the negative electrode (S79). In this case, the processor or the like of the aging determination apparatus 3 executes the process at the time of charging with the first electric current, and updates the estimation results for the electric potentials (electric potential variations) of the positive electrode and the negative electrode at the time of charging with the first electric current (in the steady or quasi-steady state).

If the elapsed time is within the predetermined time period (S73—Yes), the correction coefficient arithmetic unit estimates electric potentials (electric potential variations) of the positive electrode and the negative electrode at the time of charging with the second electric current based on electric potentials (electric potential variations) of the positive electrode and the negative electrode at the time of charging with the first electric current and the measurement results of the impedances of the positive electrode and the negative electrode at the time of charging with the second electric current (S74). Then, the correction coefficient arithmetic unit 15 calculates the correction coefficient for at least one of the positive electrode and the negative electrode based on the estimation results for the electric potentials of the positive electrode and the negative electrode at each of the time of charging with the first electric current and the time of charging with the second electric current (S75). At this time the correction coefficient arithmetic unit 15 calculates the correction coefficient $\Delta C_c$ for the positive electrode using the aforementioned formula (4-A) or the like, and calculates the correction coefficient $\Delta C_a$ for the negative electrode using the aforementioned formula (4-B) or the like.

Then, the internal state estimation unit 13 estimates the capacity and the lithium concentration for each of the positive electrode and the negative electrode through the fitting calculation or the like using the correction coefficient $\Delta C_c$ for the positive electrode and using formula (5-C), and through the fitting calculation or the like using the correction coefficient $\Delta C_a$ for the negative electrode and using formula (6-C) (S76). The internal state estimation unit 13 further estimates the electric potential of each of the positive electrode and the negative electrode as described above in the steady or quasi-steady state, based on the estimation results of the capacity and the lithium concentration in each of the positive electrode and the negative electrode, and estimates the available electric potential range or the like of each of the positive electrode and the negative electrode as described above (S77). The processor or the like of the aging determination apparatus 3 finishes the charging of the battery 5 (S78), and stores the estimation results for the internal states or the like (S79).

As described above, according to the present embodiment, the impedance of each of the positive electrode and the negative electrode is measured in the charging at a high charging rate, such as the time of charging with the second electric current. With regard to the target electrode, which is at least one of the positive electrode and the negative electrode of the battery, the processor or the like of the aging determination apparatus 3 estimates a correction coefficient to correct a difference between a lithium concentration distribution in the target electrode when charging with the first electric current and a lithium concentration distribution in the target electrode when charging with the second electric current based on a difference between an electric potential of the target electrode at the time of charging with the first electric current (in the steady or quasi-steady state) and an electric potential of the target electrode at the time of charging with the second electric current (in the unsteady state) and an impedance of the target electrode when charging with the second electric current. Therefore, even when the lithium concentration is non-uniform in at least one of the positive electrode and the negative electrode due to a rapid charging of the battery 5, an influence resulting from the non-uniformity of the lithium concentration can be appropriately corrected by the correction coefficient.

Furthermore, since the correction coefficient is calculated for each of the positive electrode and the negative electrode, even when the battery 5 is rapidly charged at a high charging rate, such as at the time of charging with the second electric current, the internal states of the battery 5 can be appropriately estimated by the aforementioned calculation using the correction coefficients. As a result, even in the state where the battery 5 is rapidly charged, the capacity and the lithium concentration in each of the positive electrode and the negative electrode are appropriately estimated, and the internal state parameters of the battery 5 are appropriately estimated.

Since the internal states of the battery 5 are appropriately estimated even in the state where the battery 5 is rapidly charged, the battery 5 can be used more safely. For example, since the capacity of the negative electrode can be appropriately estimated even in the state where the battery 5 is rapidly charged, a reduction of the capacity of the negative electrode can be appropriately predicted, so that overcharging or the like of the battery 5 due to a reduction of the capacity of the negative electrode can be effectively prevented. Furthermore, since the capacity of the positive electrode can be appropriately estimated even in the state where the battery 5 is rapidly charged, a reduction of the capacity of the positive electrode can be appropriately predicted, so that over-discharge or the like of the battery 5 due to a reduction of the capacity of the positive electrode can be effectively prevented. In addition, since the lithium concentration in the positive electrode can be appropriately estimated even in the state where the battery 5 is rapidly charged, an increase of the lithium concentration in the positive electrode can be appropriately predicted, so that a side reaction or like the due to an increase of the lithium concentration in the positive electrode can be effectively suppressed. Since the side reaction or the like can be effectively suppressed, the acceleration in aging of the battery 5 can be effectively prevented.

At the time of charging with the second electric current, the correction coefficient may be calculated for one of the positive electrode and the negative electrode. In other words, it suffices that the correction coefficient is calculated for the target electrode, which is at least one of the positive electrode and the negative electrode, and the internal states of the battery 5 are estimated as described above using the correction coefficients in rapid charging of the battery 5 at a high charging rate, such as the time of charging with the second electric current.

(Verification Relating to the Embodiment)

The following verification was conducted in connection with the embodiment. In the verification, with respect to each of test elements A, B, and C, a full-charge capacity at the time of charging at a charging rate of 1 C was measured, and full-charge capacities in the respective times of charging at a plurality of charging rates of 3 C and higher were measured. Based on the measurement results, with respect to each of the test elements A to C, a capacity retention ratio of the capacity when charged at each of the charging rates of 3 C and higher with respect to the capacity when charged at the charging rate of 1 C was calculated.

As the test element A, a battery cell including a positive electrode and a negative electrode was used. In the test element A, a lithium-nickel-cobalt-manganese composite oxide is used as a positive electrode active material, and lithium titanate is used as a negative electrode active material. In the test element A, an active material-containing layer in each of the positive electrode and the negative electrode is so thick that the thickness of each of the positive electrode and the negative electrode is 40 µm to 50 µm. The test element B is formed only of the positive electrode of the battery cell of the test element A. In the test element B, the active material-containing layer of the positive electrode is thinner than that in the test element A; the thickness of the positive electrode is 10 µm. The test element C is formed only of the negative electrode of the battery cell of the test element A. In the test element C, the active material-containing layer of the negative electrode is thinner than that in the test element A; the thickness of the negative electrode is 10 µm.

Figure 8:
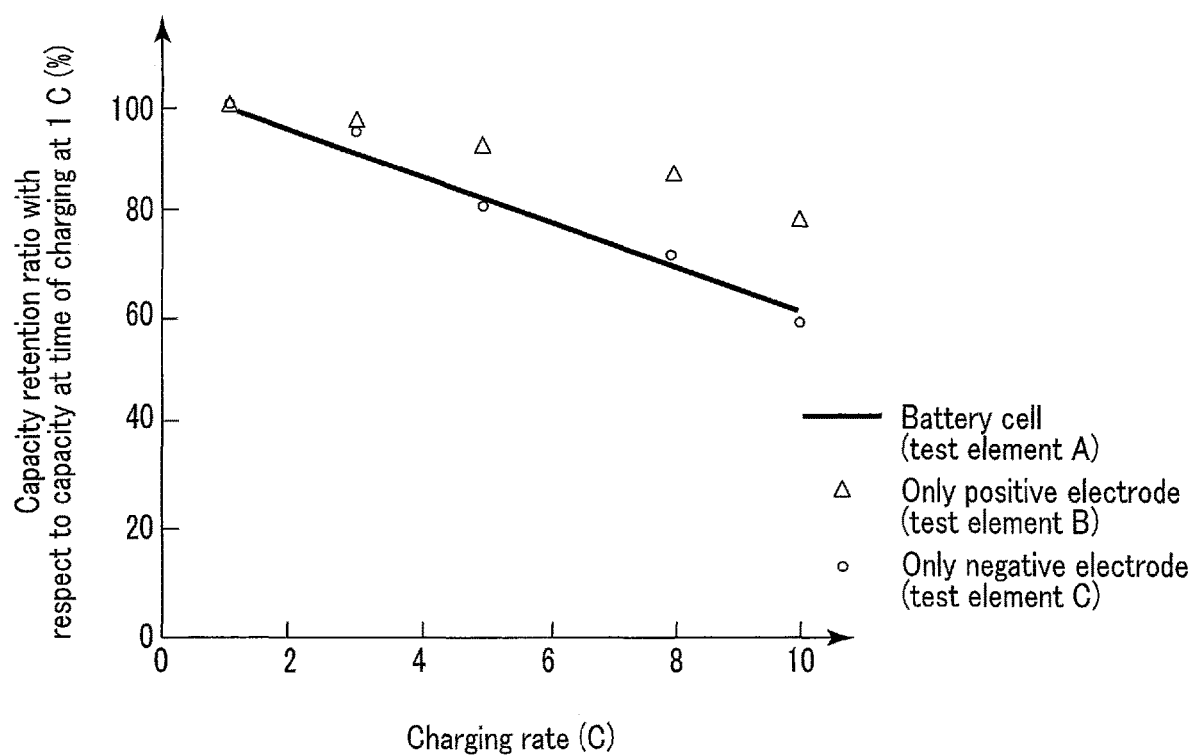
FIG. 8 is a schematic view illustrating results of calculation of retention ratios of capacities of three test elements used in verification with respect to the capacity when the respective elements are charged at 1 C.

FIG. 8 is a schematic view illustrating results of calculation of retention ratios of capacities of the three test elements used in verification with respect to the capacity for a time of charging at 1 C. In FIG. 8, the abscissa axis represents a charging rate at the C rate, and the ordinate axis represents a capacity retention ratio, as a percentage with respect to the capacity for a time of charging at 1 C. In FIG. 8, the capacity retention ratio of the test element A, which is a battery cell, is represented by a solid line, the capacity retention ratio of the test element B, which is the positive electrode, is represented by triangular plots, and the capacity retention ratio of the test element C, which is the negative electrode, is represented by circular plots.

As shown in FIG. 8, in the test element A, the capacity retention ratio linearly decreased as the charging rate increased. In the test element A, which is the battery cell, the relation of the capacity retention ratio with respect to the charging rate was similar to that in the test element C, which is the negative electrode. The test element A and the test element C had a similar tendency in the relation of the capacity retention ratio with respect to the charging rate, although the test element A and the test element C were different in thickness of the active material containing layer in the negative electrode. This proved that an influence of non-uniformity of the lithium concentration in the negative electrode is great at a time of charging at a high charging rate in a battery cell formed of the active material similar to that in the test element A, namely, a battery cell using lithium titanate as the negative electrode active material. In other words, it was proved that, in a battery cell using lithium titanate as the negative electrode active material, an influence of non-uniform lithium concentration distribution in the negative electrode is great at a time of charging at a high charging rate.

In the test element A, there is no tendency for the degree of reduction of the capacity retention ratio to become larger as the charging rate becomes higher; the capacity retention ratio linearly decreased as the charging rate increased. Furthermore, as described above, the test element A and the test element C had a similar tendency in the relation of the capacity retention ratio with respect to the charging rate, although the test element A and the test element C were different in thickness. Thus, it was proved that, in a battery cell formed of an active material similar to that in the test element A, an influence of the concentration distribution of the electrolyte in the battery is small at a time of charging at a high charging rate.

In the test element B, which is the positive electrode, the degree of reduction of the capacity retention ratio with the increase of the charging rate is smaller as compared to the test element A, which is the battery cell, and the test element C, which is the negative electrode. Therefore, it was proved that, in a battery cell formed of an active material similar to that in the test element A, an influence of the lithium concentration distribution in the positive electrode is small at a time of charging at a high charging rate.

Based on the verification described above, to appropriately estimate the internal states of the battery cell formed of the active material similar to that in the test element A, it is necessary to estimate the aforementioned correction coefficient $\Delta C_a$ for at least the negative electrode. The internal states of the battery cell need to be estimated through the fitting calculation or the like using the estimated correction coefficient $\Delta C_a$ and formula (6-C) described above.

At least one embodiment or example described above estimates, with regard to a target electrode which is at least one of a positive electrode and a negative electrode of the battery, a correction coefficient to correct a difference between a lithium concentration distribution in the target electrode when charging with the first electric current and a lithium concentration distribution in the target electrode when charging with the second electric current based on a difference between an electric potential of the target electrode at the time of charging with the first electric current and an electric potential of the target electrode at the time of charging with the second electric current greater than the first electric current, and an impedance of the target electrode when charging with the second electric current. Accordingly, it is possible to provide an aging determination method of a battery, an aging determination apparatus of the battery, a management system of the battery, a battery-mounted device, and a non-transitory storage medium that can appropriately correct an influence resulting from the non-uniformity of the lithium concentration, even when the lithium concentration is non-uniform in at least one of the positive electrode and the negative electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An aging determination method of determining an aging of a battery which is a target of determination, the method comprising:

with regard to a target electrode which is at least one of a positive electrode and a negative electrode of the battery, estimating a correction coefficient to correct a difference between a lithium concentration distribution in the target electrode at a time of charging with a first electric current and a lithium concentration distribution in the target electrode at a time of charging with a second electric current greater than the first electric current based on a difference between an electric potential of the target electrode at the time of charging of the battery with the first electric current and an electric potential of the target electrode at the time of charging of the battery with the second electric current, and an impedance of the target electrode at the time of charging with the second electric current.

2. The aging determination method according to claim 1, wherein
the estimating the correction coefficient includes:
multiplying a difference value between the second electric current and the first electric current by the impedance of the target electrode at a certain charge amount at the time of charging with the second electric current so as to calculate a multiplication value at the certain charge amount;
removing an element of the calculated multiplication value from a first electric potential so as to calculate a second electric potential, the first electric potential being an electric potential of the target electrode at the certain charge amount at the time of charging with the second electric current; and
calculating the correction coefficient based on a difference between the second electric potential and a third electric potential, the third electric potential being an electric potential of the target electrode at the certain charge amount equal to that at the first electric potential at the time of charging with the first electric current.

3. The aging determination method according to claim 2, wherein
in a case of calculating the correction coefficient for the positive electrode of the battery as the target electrode, the second electric potential is calculated from the first electric potential through formula (A-1) below, and
in a case of calculating the correction coefficient for the negative electrode of the battery as the target electrode, the second electric potential is calculated from the first electric potential through formula (A-2) below, $$V_c2'=V_c2-R_c2\times(I2-I1) \quad (A-1)$$

$$V_a2'=V_a2+R_a2\times(I2-I1) \quad (A-2)$$

where $V_c2$ represents the first electric potential of the positive electrode, $R_c2$ represents the impedance of the positive electrode at the certain charge amount at the time of charging with the second electric current, $V_c2'$ represents the second electric potential of the positive electrode, $V_a2$ represents the first electric potential of the negative electrode, $R_a2$ represents the impedance of the negative electrode at the certain charge amount at the time of charging with the second electric current, $V_a2'$ represents the second electric potential of the negative electrode, I1 represents the first electric current, and I2 represents the second electric current.

4. The aging determination method according to claim 1, further comprising:
estimating an internal state of the battery based on the impedance of the target electrode at the time of charging with the second electric current, and the estimated correction coefficient.

5. The aging determination method according to claim 4, wherein
the estimating an internal state of the battery includes:
in a case of estimating the correction coefficient for the positive electrode of the battery as the target electrode, calculating a capacity and the lithium concentration of the positive electrode by performing a fitting calculation using the impedance of the positive electrode at the time of charging with the second electric current, the correction coefficient for the positive electrode, and formula (B-1) below;

in a case of estimating the correction coefficient for the negative electrode of the battery as the target electrode, calculating a capacity and the lithium concentration of the negative electrode by performing a fitting calculation using the impedance of the negative electrode at the time of charging with the second electric current, the correction coefficient for the negative electrode, and formula (B-2) below, $$R_c \approx 1/(kw_c(C_{c,max}-(C_c+\Delta C_c))^{0.5}(C_c+\Delta C_c)^{0.5}) \quad (B-1)$$

$$R_a \approx 1/(kw_a(C_{a,max}-(C_a+\Delta C_a))^{0.5}(C_a+\Delta C_a)^{0.5}) \quad (B-2)$$

where $R_c2$ represents the impedance of the positive electrode, $w_c$ represents the capacity of the positive electrode, $C_c$ represents the lithium concentration in the positive electrode, $C_{c,max}$ represents the lithium concentration in the positive electrode in a full-charge state of the positive electrode, $\Delta C_c$ represents the correction coefficient of the positive electrode, $R_a2$ represents the impedance of the negative electrode, $w_a$ represents the capacity of the negative electrode, $C_a$ represents the lithium concentration in the negative electrode, $C_{a,max}$ represents the lithium concentration in the negative electrode in a full-charge state of the negative electrode, $\Delta C_a$ represents the correction coefficient of the negative electrode, and k represents a constant based on a Butler-Volmer equation.

6. The aging determination method according to claim 1, further comprising:
estimating an electric potential curve indicative of a relation of the electric potential of the target electrode to a charge amount at the time of charging with the first electric current by estimating an internal state of the battery through a fitting calculation using an impedance of the target electrode at the time of charging with the first electric current; and
estimating an electric potential of the target electrode at the time of charging with the second electric current based on the electric potential curve of the target electrode at the time of charging with the first electric current, and the impedance of the target electrode at the time of charging with the second electric current.

7. The aging determination method according to claim 1, further comprising:
at the time of charging with the first electric current, supplying to the battery an electric current having a current waveform in which a current value periodically fluctuates around a first reference current value; and
at the time of charging with the second electric current, supplying to the battery an electric current having a current waveform in which a current value periodically fluctuates around a second reference current value greater than the first reference current value.

8. An aging determination apparatus for determining an aging of a battery which is a target of determination, the apparatus comprising:
a processor configured to estimate, with regard to a target electrode which is at least one of a positive electrode and a negative electrode of the battery, a correction coefficient to correct a difference between a lithium concentration distribution in the target electrode at a time of charging with a first electric current and a lithium concentration distribution in the target electrode at a time of charging with a second electric current greater than the first electric current based on a difference between an electric potential of the target electrode at the time of charging of the battery with the first electric current and an electric potential of the target electrode at the time of charging of the battery with the second electric current, and an impedance of the target electrode at the time of charging with the second electric current.

9. A battery management system comprising:
the aging determination apparatus according to claim 8; and
the battery for which determining the aging is performed by the aging determination apparatus.

10. A battery-mounted device comprising:
the aging determination apparatus according to claim 8; and
the battery for which determining the aging is performed by the aging determination apparatus.

11. A non-transitory storage medium storing an aging determination program for determining an aging of a battery which is a target of determination, the program causing a computer to:
with regard to a target electrode which is at least one of a positive electrode and a negative electrode of the battery, estimate a correction coefficient to correct a difference between a lithium concentration distribution in the target electrode at a time of charging with a first electric current and a lithium concentration distribution in the target electrode at a time of charging with a second electric current greater than the first electric current based on a difference between an electric potential of the target electrode at the time of charging of the battery with the first electric current and an electric potential of the target electrode at the time of charging of the battery with the second electric current, and an impedance of the target electrode at the time of charging with the second electric current.

* * * * *